US012765018B2

(12) United States Patent
Hsu et al.

(10) Patent No.: US 12,765,018 B2
(45) Date of Patent: Oct. 13, 2026

(54) SEMICONDUCTOR DEVICES AND METHODS OF FABRICATING THE SAME

(71) Applicant: Taiwan Semiconductor Manufacturing Company Ltd., Hsinchu (TW)

(72) Inventors: Chen An Hsu, Hsinchu (TW); Chien-Wei Lee, Hsinchu (TW); Anhao Cheng, Hsinchu (TW); Yen-Liang Lin, Hsinchu (TW); Ru-Shang Hsiao, Hsinchu (TW); Wei-Lun Chung, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 388 days.

(21) Appl. No.: 18/507,039

(22) Filed: Nov. 11, 2023

(65) Prior Publication Data

US 2025/0072070 A1 Feb. 27, 2025

Related U.S. Application Data

(60) Provisional application No. 63/520,829, filed on Aug. 21, 2023.

(51) Int. Cl.
*H01L 29/08* (2006.01)
*H01L 21/8234* (2006.01)
(Continued)

(52) U.S. Cl.
CPC ......... *H10D 62/151* (2025.01); *H10D 64/017* (2025.01); *H10D 84/013* (2025.01); *H10D 84/038* (2025.01); *H10D 84/83* (2025.01)

(58) Field of Classification Search
CPC .. H10D 62/151; H10D 64/017; H10D 84/013; H10D 84/038; H10D 84/83;
(Continued)

(56) References Cited

U.S. PATENT DOCUMENTS

| | | | | |
|---|---|---|---|---|
| 2015/0200299 A1* | 7/2015 | Chen | .................... | H10D 62/021 438/285 |
| 2018/0108775 A1* | 4/2018 | More | .................... | H10D 84/013 |
| 2022/0051947 A1* | 2/2022 | More | .................... | H10D 84/017 |

FOREIGN PATENT DOCUMENTS

| | | |
|---|---|---|
| KR | 10-2020-0138679 A | 12/2020 |
| KR | 10-2021-0128898 A | 10/2021 |

(Continued)

OTHER PUBLICATIONS

Notice of Allowance issued in Korean Appl. No. 10-2024-0109812 dated Sep. 5, 2025.

(Continued)

*Primary Examiner* — Tong-Ho Kim
(74) *Attorney, Agent, or Firm* — Foley & Lardner LLP

(57) ABSTRACT

A semiconductor structure includes a substrate and a first epitaxial source/drain feature extending into the semiconductor layer. The semiconductor structure includes a first doped region located in the semiconductor layer below the first epitaxial source/drain feature. The first doped region includes a dopant at a first concentration. The semiconductor structure includes a second epitaxial source/drain feature extending into the semiconductor layer. The semiconductor structure includes a second doped region located in the semiconductor layer below the second epitaxial source/drain feature. The second doped region includes the dopant at a second concentration that is less than the first concentration.

20 Claims, 19 Drawing Sheets

(51) Int. Cl.

| | |
|---|---|
| ***H01L 27/088*** | (2006.01) |
| ***H01L 29/66*** | (2006.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |

(58) Field of Classification Search

CPC ...... H10D 30/024; H10D 30/62; H10D 84/85; H10D 84/017; H10D 62/021; H10D 62/121; H10D 62/371; H10D 62/822; H10D 64/251; H10D 84/8312; H10D 84/834; H01L 21/77

USPC .......................................................... 257/288

See application file for complete search history.

(56) References Cited

FOREIGN PATENT DOCUMENTS

| | | | |
|---|---|---|---|
| KR | 10-2022-0113231 | A | 8/2022 |
| KR | 10-2023-0056570 | A | 4/2023 |
| TW | 202320181 | A | 5/2023 |

OTHER PUBLICATIONS

Office Action issued in connection with Korean Appl. No. 10-2024-0109812 dated Feb. 19, 2025.

Office Action issued in connection with Taiwan Appl. No. 113100700 dated Apr. 17, 2025.

* cited by examiner

SEMICONDUCTOR DEVICES AND METHODS OF FABRICATING THE SAME

CROSS-REFERENCE TO RELATED PATENT APPLICATIONS

This application claims the benefit and priority to U.S. Provisional Application No. 63/520,829, filed on Aug. 21, 2023, which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
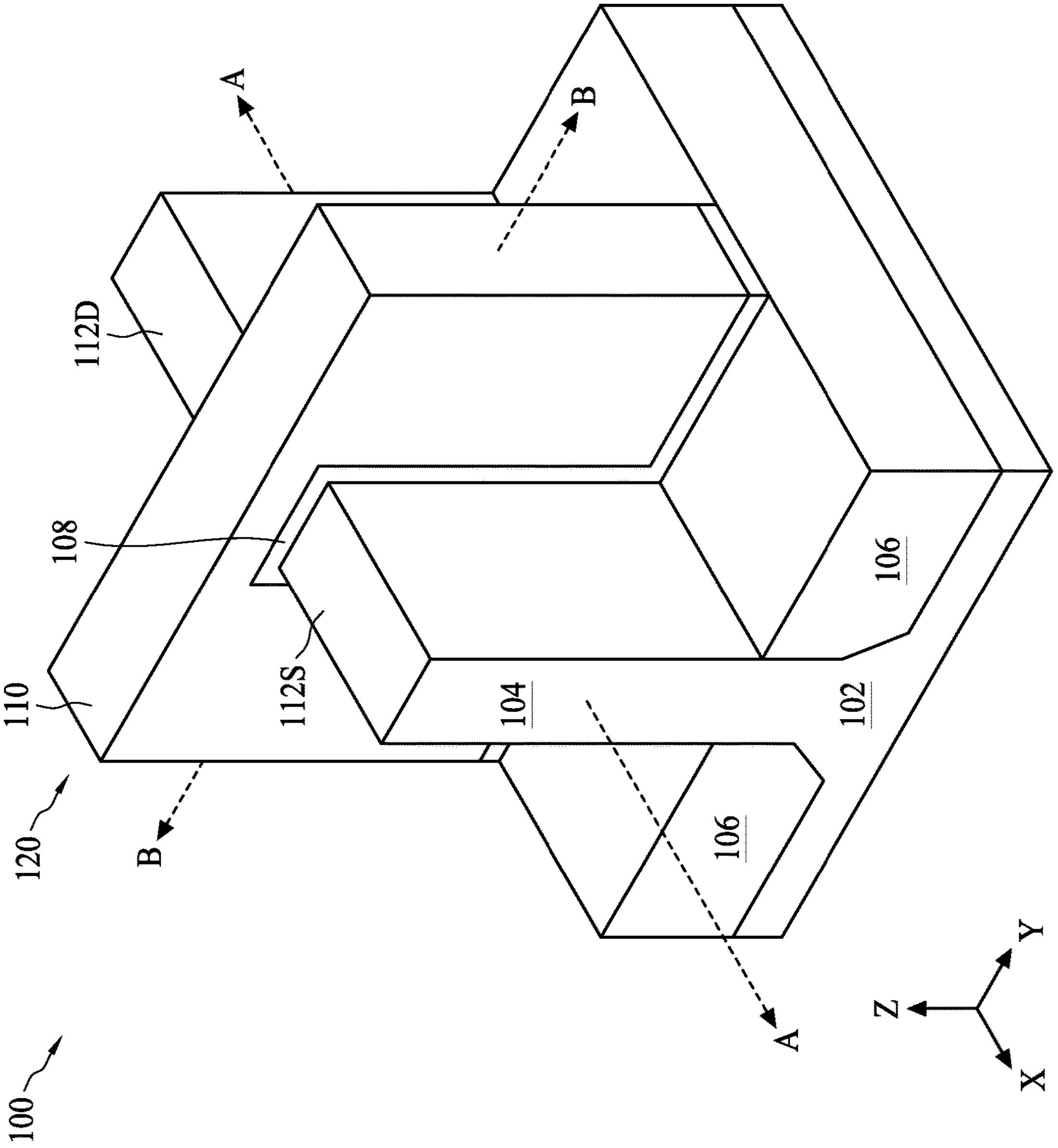
FIG. 1 illustrates a three-dimensional perspective view of an example semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the terms "about" and "approximately" generally mean plus or minus 10% of the stated value. For example, about 0.5 would include 0.45 and 0.55, about 10 would include 9 to 11, about 1000 would include 900 to 1100.

Figure 3:
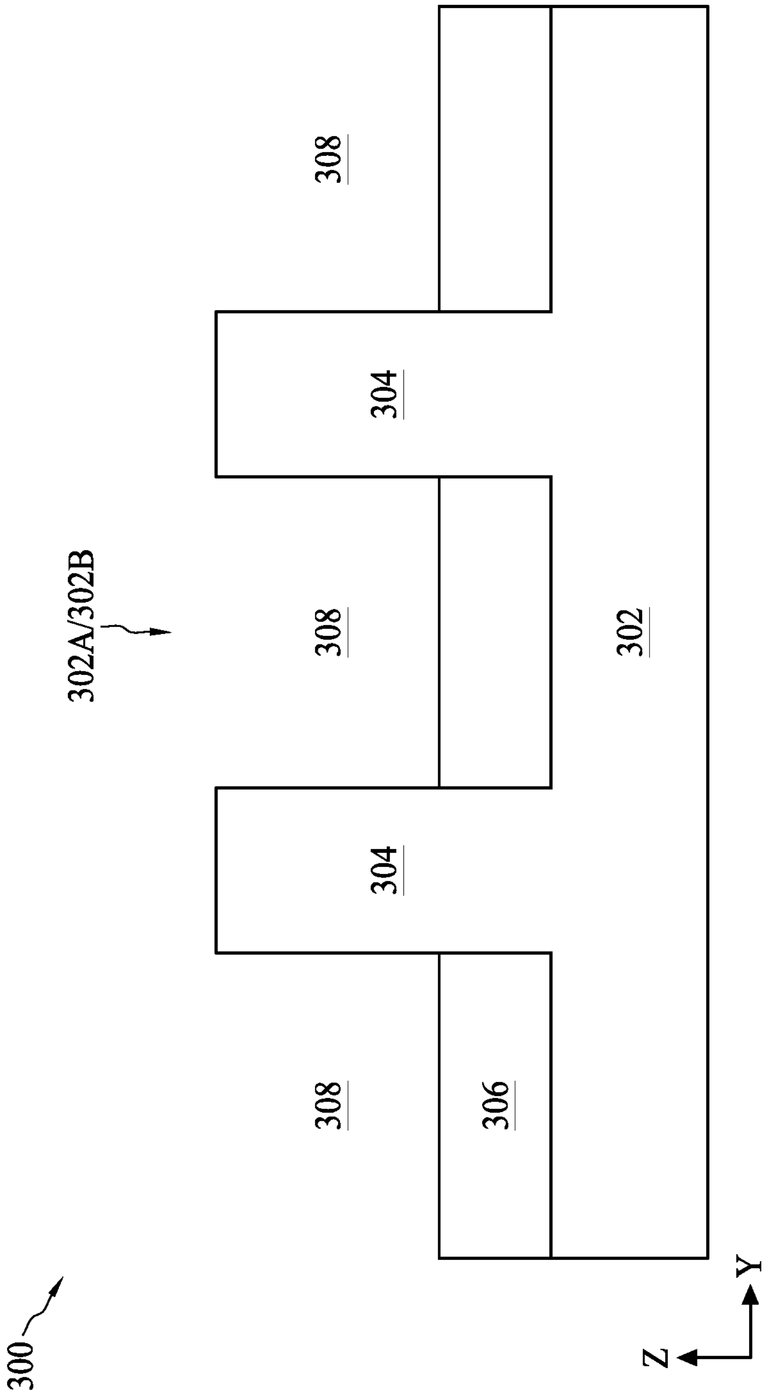
FIGS. 3 and 4 illustrate cross-sectional views of an example semiconductor device, or a portion thereof, analogous to the example semiconductor device of FIG. 1 along line B-B during various fabrication stages of the example method of FIG. 2A, in accordance with some embodiments of the present disclosure.
Figure 4:
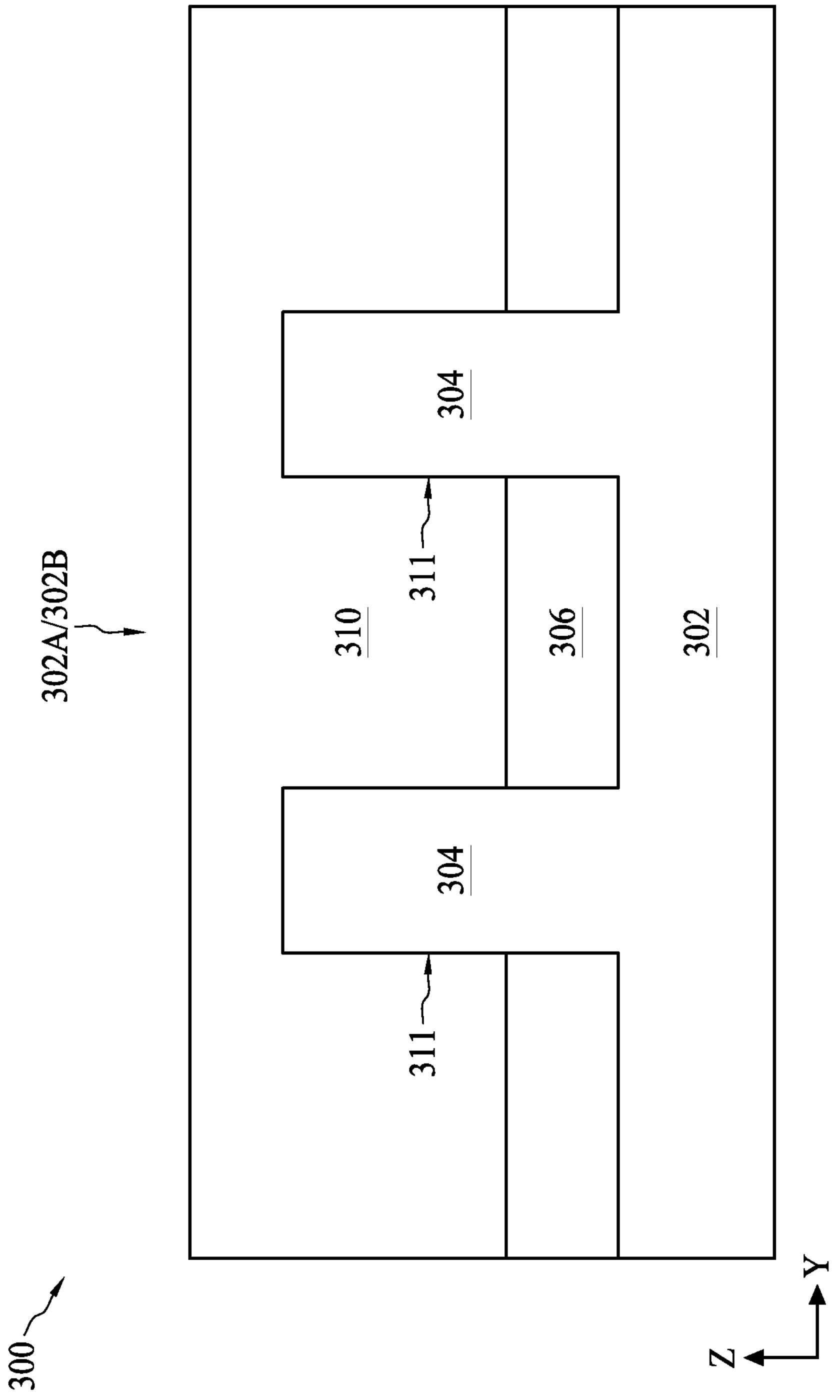

FIG. 1 illustrates a perspective view of an example non-planar semiconductor device (hereafter referred to as device) 100, in accordance with various embodiments. The device 100 includes a substrate 102 and a fin 104 protruding above the substrate 102. Isolation regions 106 are formed on opposing sides of the fin 104, with the fin 104 protruding above the isolation regions 106. A gate dielectric layer 108 traverses a channel region of the fin 104, such that it is formed along sidewalls and over a top surface of the fin 104, and a gate electrode 110 is over the gate dielectric layer 108, which together form a gate structure 120. Source/drain regions 112D and 112S (over which source/drain features, not depicted, are formed) are disposed in and over the fin 104 and on opposing sides of the gate dielectric layer 108 and the gate electrode 110. The source/drain regions 112D and 112S extend outward from the gate electrode 110. FIG. 1 is provided as a reference to illustrate a number of cross-sections in subsequent figures. For example, cross-sections illustrated in FIGS. 3 and 4 are taken along line B-B (i.e., along the Y axis), which extends along a longitudinal axis of the gate structure 120 of the device 100. Cross-sections illustrated in FIGS. 5-16 are taken along line A-A (i.e., along the X axis), which extends along a longitudinal axis of the fin 104 and in a direction of, for example, a current flow across the channel region of the fin 104 between the source/drain regions 112S/112D. Subsequent figures refer to these reference cross-sections for clarity. Source/drain region(s) may refer to a source or a drain, individually or collectively dependent upon the context and are configured to provide source/drain features discussed in detail below.

Figure 2A:
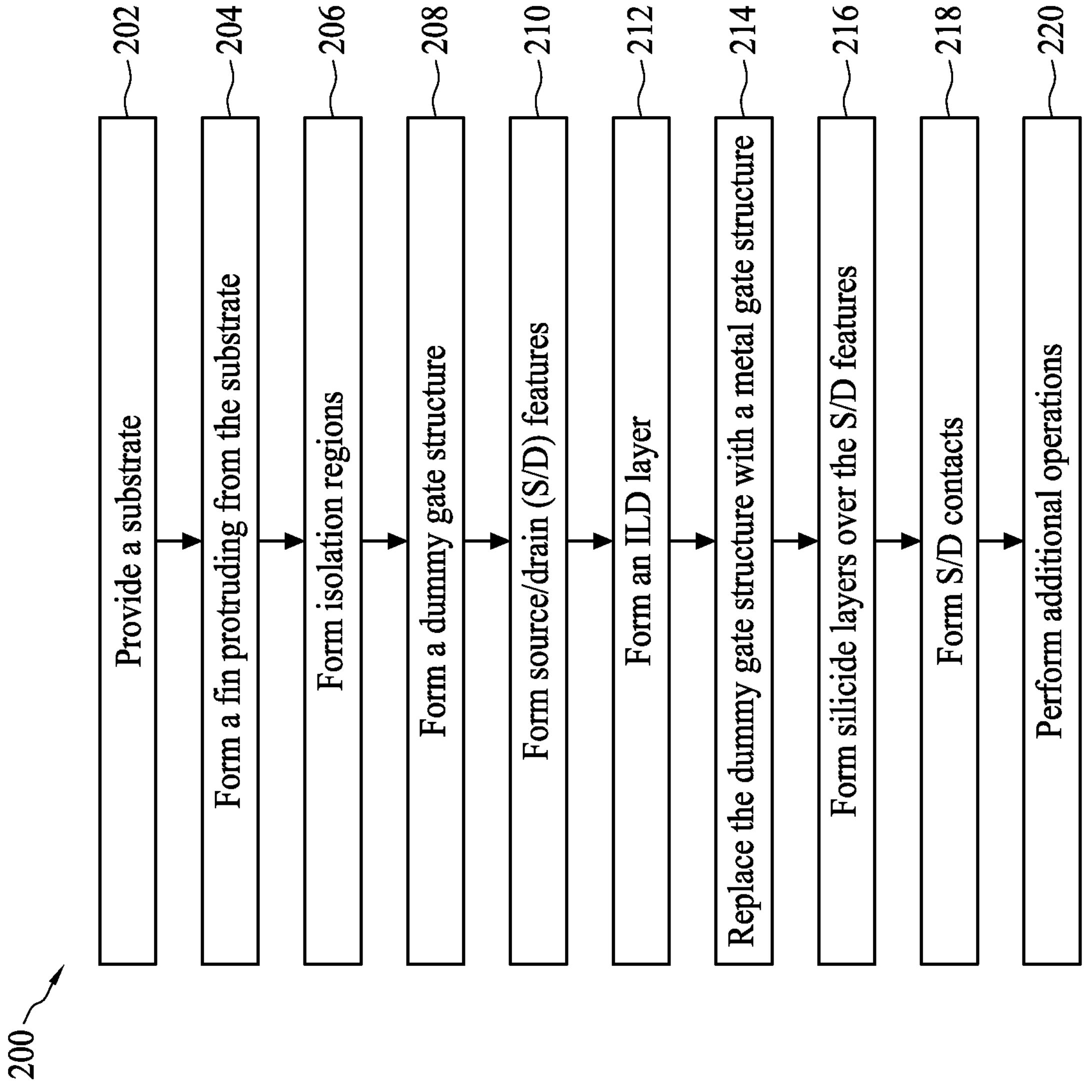
FIG. 2A illustrates a flow chart of an example method for making an example semiconductor device, in accordance with some embodiments of the present disclosure.
Figure 2B:
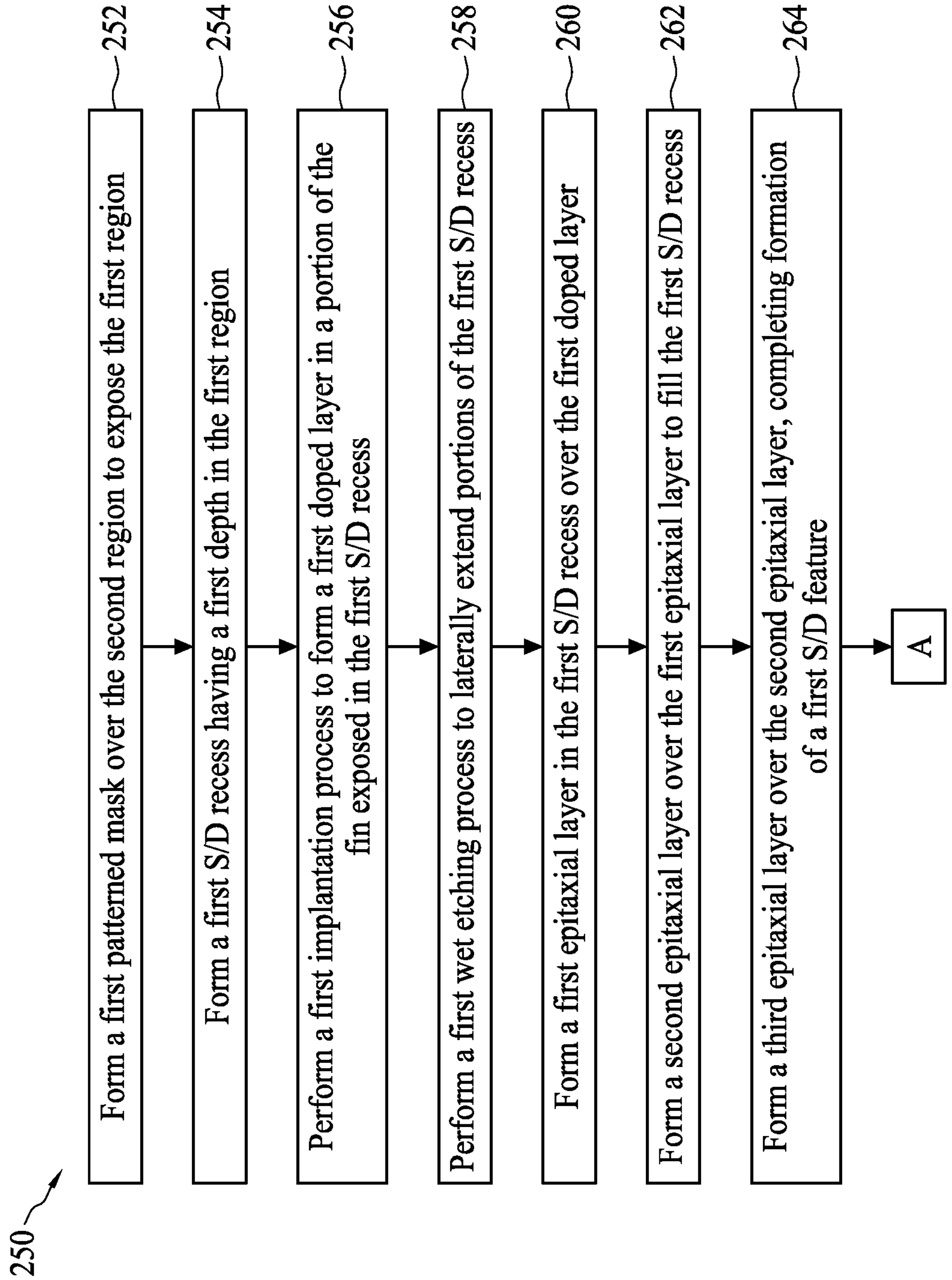
FIGS. 2B and 2C collectively illustrate a flow chart of an example method for implementing a portion of the example method of FIG. 2A, in accordance with some embodiments of the present disclosure.
Figure 2C:
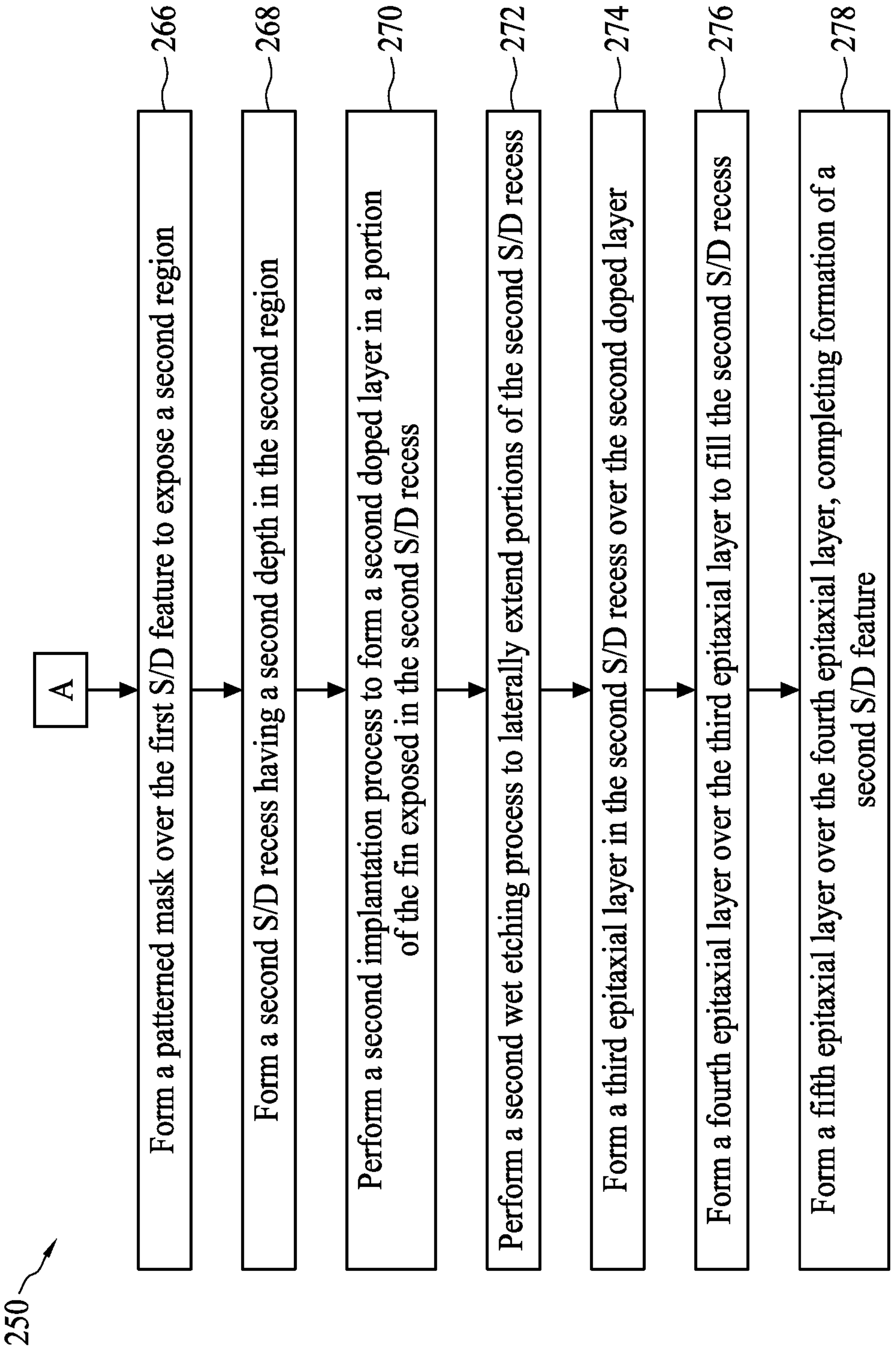

FIG. 2A illustrates a flowchart of a method 200 to form a non-planar semiconductor device, according to one or more embodiments of the present disclosure. For example, at least some of the operations of the method 200 can be used to form a planar device, a three-dimensional fin-like device (e.g., a FinFET), or the like. It is noted that the method 200 is merely an example, and is not intended to limit the present disclosure. Accordingly, it is understood that additional operations may be provided before, during, and after the method 200 of FIG. 2A, and that some other operations may only be briefly described herein. In some embodiments, operations of the method 200 may be associated with cross-sectional views of an example device 300 at various fabrication stages as shown in FIGS. 3-16, which will be discussed in further detail below. FIGS. 2B and 2C collectively illustrate a flowchart of a method 250 to form a portion of the device 300, according to one or more embodiments of the present disclosure. Furthermore, embodiments of the device 300 are not limited to those depicted herein. For example, the device 300 may include a number of other devices such as inductors, fuses, capacitors, coils, etc., which are not shown herein for purposes of clarity.

Referring to FIGS. 2A and 3, the method 200 at operation 202 provides a substrate 302 of the device 300. The substrate 302 may be a semiconductor substrate (or semiconductor layer), such as a bulk semiconductor, a semiconductor-on-insulator (SOI) substrate, or the like, which may be doped (e.g., with a P-type or an N-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In the present embodiments, the substrate 302 includes a first region 302A and a second region 302B configured to provide various devices, such as planar metal-oxide-semiconductor field-effect transistors (MOSFETs), three-dimensional fin-like MOSFETs (FinFETs), other types of MOSFETs, or combinations thereof. In the present embodiments, the device 300 provides at least one FinFET. The first region 302A and the second region 302B may be configured to form devices of the same conductivity type or different conductivity types depending upon the type(s) of dopant present therein. For example, in the depicted embodiments, the first region 302A and the second region 302B each include an N-type doped well configured to provide a P-type device (e.g., a PMOS device). In some embodiments, the first region 302A includes an N-type doped well configured to provide a PMOS device, and the second region 302B includes a P-type doped well configured to provide an N-type device (e.g., an NMOS device). The N-type doped well may include an N-type dopant, such as phosphorous (P), arsenic (As), the like, or combinations thereof. The P-type doped well may include a P-type dopant, such as boron (B), gallium (Ga), indium (In), the like, or combinations thereof.

Embodiments depicted in FIGS. 3 and 4, which are taken along line B-B of FIG. 1, are representative of the structures of the device 300 in either the first region 302A or the second region 302B at various fabrication stages of the method 200 and/or the method 250. The first region 302A and the second region 302B may be disposed adjacent one another, though the present disclosure does not require such configuration. For purposes of illustration, the first region 302A and the second region 302B are depicted to be formed along line A-A, which is the longitudinal axis of a fin (e.g., a semiconductor fin), in FIGS. 5-16. In other words, a common fin may extend through both of first region 302A and the second region 302B. Alternatively, the first region 302A and the second region 302B may be arranged along line B-B, which is the longitudinal axis of a gate structure (e.g., dummy gate structure 310).

Still referring to FIGS. 2A and 3, the method 200 at operation 204 forms a (semiconductor) fin 304 to protrude or extend vertically from the substrate 302. The fin 304 may be more generically referred to as a semiconductor layer protruding from the substrate 302. Although two fins 304 are shown in the illustrated embodiment of FIGS. 3 and 4, it should be appreciated that the device 300 can include any number of the fins 304 while remaining within the scope of the present disclosure. In some embodiments, the operation 204 is omitted, such that the device 300 is configured as a planar MOSFET, rather than a FinFET.

In some embodiments, the fins 304 are formed by patterning the substrate 302 using, for example, photolithography and etching techniques. For example, a mask layer (not depicted), including a pad oxide layer and an overlying pad nitride layer, is formed over the substrate 302. The pad oxide layer may be a thin film comprising silicon oxide formed, for example, using a thermal oxidation process. The pad oxide layer may act as an adhesion layer between the substrate 302 and the overlying pad nitride layer. In some embodiments, the pad nitride layer is formed of silicon nitride, silicon oxynitride, silicon carbonitride, the like, or combinations thereof. The pad oxide layer and the pad nitride layer may each be formed using low-pressure chemical vapor deposition (LPCVD) or plasma enhanced-chemical vapor deposition (PECVD), for example.

The mask layer may be patterned using photolithography techniques. Generally, photolithography techniques utilize a photoresist material (not depicted) that is deposited, irradiated (or exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask, which is subsequently used to pattern exposed portions of the substrate 302 to form trenches 308, thereby defining the fins 304 separated by the trenches 308 as depicted in FIG. 3. When multiple fins are formed, such a trench 308 may be disposed between any two adjacent fins 304. In some embodiments, the fins 304 are formed by etching the trenches 308 in the substrate 302 using, for example, reactive ion etch (RIE), neutral beam etch (NBE), the like, or combinations thereof. The etching may be anisotropically implemented. In some embodiments, the trenches 308 may be strips (viewed from the top) parallel to each other, and closely spaced with respect to each other. In some embodiments, the trenches 308 may be continuous and surround each fin 304. In this regard, though not depicted herein, a top surface of the resulting fins 304 is overlaid with the patterned mask until a subsequent fabrication step removes it.

The fins 304 may be patterned by other suitable methods. In one example, the fins 304 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not depicted) is formed over the substrate 302 and patterned using a photolithography process. Spacers (not depicted) are formed alongside the patterned sacrificial layer using a self-aligned process. The sacrificial layer is then removed, and the remaining spacers, or mandrels, may then be used to pattern the fins 304.

In another example, a top portion of the substrate 302 may be replaced by or overlaid with a suitable material, such as an epitaxial material (not depicted) suitable for an intended type (e.g., N-type or P-type) of semiconductor devices to be formed. The epitaxial material may be grown over the substrate 302 by any suitable epitaxial process. Thereafter, the substrate 302, with the epitaxial material provided over the top portion, is patterned by a photolithography process described herein, for example, to form the fins 304 that include the epitaxial material.

Still referring to FIGS. 2A and 3, the method 200 at operation 206 forms isolation regions 306 over the substrate 302 to surround bottom portions of the fins 304. The isolation regions 306, which are formed of a dielectric (or insulating) material, can electrically isolate neighboring fins 304 from one another. The dielectric material may include an oxide, such as silicon oxide (SiO and/or $SiO_2$), a nitride, a low-k (e.g., having a dielectric constant less than that of silicon oxide, which is about 3.9) dielectric material (e.g., phosphosilicate glass (PSG), borosilicate glass (BSG), boron-doped phosphosilicate glass (BPSG), undoped silicate glass (USG), etc.), the like, or combinations thereof, and may be formed by a high density plasma chemical vapor deposition (HDPCVD), a flowable CVD (FCVD) (e.g., a CVD-based material deposition in a remote plasma system, followed by an annealing or curing process to densify the deposited material into another material, such as an oxide), spin coating, the like, or combinations thereof. Other dielectric materials and/or other formation processes may be used to form the isolation regions 306. In the depicted embodiments, the dielectric material of the isolation regions 306 include silicon oxide formed by a FCVD process. An annealing process may be performed once the dielectric material is deposited. A planarization process, such as a chemical-mechanical polish/planarization (CMP) process, may remove any excess dielectric material, such that a top surface of the dielectric material and a top surface 304T of the fins 304 (or a top surface of the substrate 302 if the device 300 includes a planar device) are substantially coplanar. The patterned mask over the top surface 304T of the fins 304 may also be removed by the planarization process.

Subsequently, the dielectric material is recessed to form the isolation regions 306 in the trenches 308, as depicted in FIG. 3. In some embodiments, the isolation regions 306 include shallow trench isolation (STI) features. The isolation regions 306 are recessed such that the upper portions of the fin 304 protrude from between neighboring isolation regions 306. Respective top surfaces of the isolation regions 306 may have a flat surface (as depicted), a convex surface, a concave surface (such as dishing), or combinations thereof. The top surfaces of the isolation regions 306 may be formed such profile(s) by any suitable etching process, such as one that is selective to the material of the isolation regions 306 with respect to the substrate 302 (and the fins 304). For example, a dry etching process or a wet etching process using dilute hydrofluoric (DHF) acid may be performed to recess the dielectric material to form the isolation regions 306.

As another example of forming the fins 304 and the isolation regions 306, a dielectric layer (not depicted) may be formed over the top surface of the substrate 302; trenches may be etched through the dielectric layer; homoepitaxial structures may be epitaxially grown in the trenches; and the dielectric layer may be recessed such that the homoepitaxial structures protrude from the dielectric layer to form the fins 304. In yet another example, a dielectric layer (not depicted) may be formed over the top surface of the substrate 302; trenches may be etched through the dielectric layer; heteroepitaxial structures may be epitaxially grown in the trenches using a material different from the substrate 302; and the dielectric layer may be recessed such that the heteroepitaxial structures protrude from the dielectric layer to form the fins 304. The epitaxially grown material(s) or structures may be in situ doped during growth, which may obviate prior and subsequent implantations although in situ and implantation doping may be used together.

Figure 5:
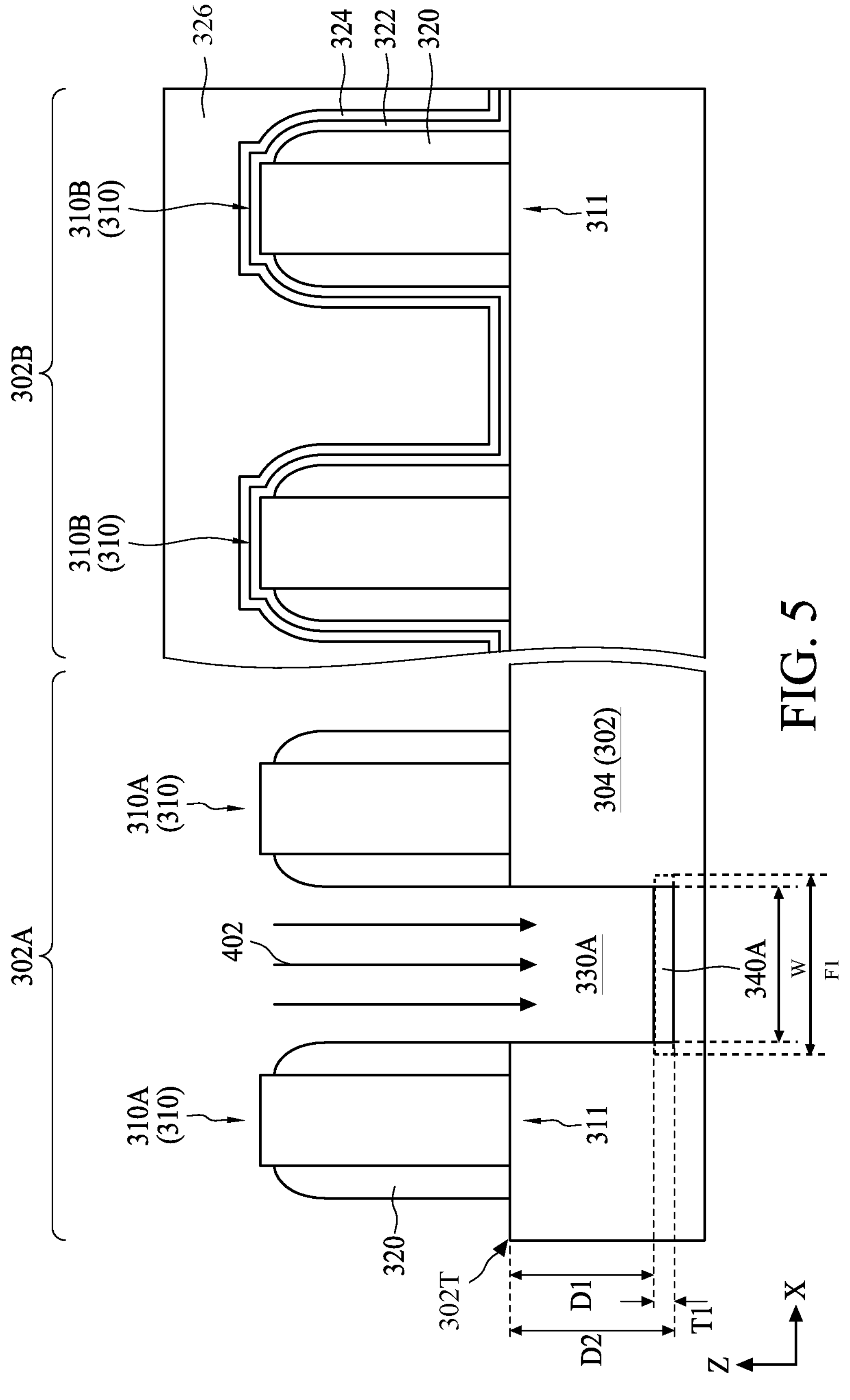
FIGS. 5, 6, 7A, 7B, 8, 9, 10, 11, 12, 13, 14, 15, and 16 illustrate cross-sectional views of an example semiconductor device, or a portion thereof, analogous to the example semiconductor device of FIG. 1 along line A-A during various fabrication stages of the example method of FIGS. 2A and/or 2B-2C, in accordance with some embodiments of the present disclosure.

Referring to FIGS. 2A, 4, and 5, the method 200 at operation 208 forms a plurality of first dummy gate structures 310A and second dummy gate structures 310B in the first region 302A and the second region 302B, respectively. For purposes of simplicity in certain portions of the present disclosure, the first dummy gate structures 310A and second dummy gate structures 310B are collectively referred to as the dummy gate structures 310. Referring to FIG. 4, each dummy gate structure 310 may traverse channel regions 311 of multiple fins 304. Although two of each of the first dummy gate structures 310A and second dummy gate structures 310B are depicted in FIG. 5 (and the subsequent figures), it should be appreciated that additional dummy gate structures 310 can be formed in each of the first region 302A and the second region 302B, respectively, while remaining within the scope of the present disclosure.

Each dummy gate structure 310 may include a dummy gate dielectric layer (not depicted separately) over the fins 304 and a dummy gate electrode (not depicted separately) over the dummy gate dielectric layer. The dummy gate structure 310 may optionally include an interfacial layer between the fins 304 and the dummy gate dielectric layer, where the interfacial layer may include an oxide, such as silicon oxide. The dummy gate dielectric layer may include any suitable dielectric material, such as silicon oxide, silicon nitride, multilayers thereof, or the like. The dummy gate electrode may include polysilicon.

Various layers of the dummy gate structure 310 may be deposited as blanket layers over the fins 304 by any suitable process, such as CVD, atomic layer deposition (ALD), or physical vapor deposition (PVD), thermally grown, or chemically grown, and then planarized by a CMP process, for example. A mask layer (not depicted) including silicon nitride or the like may be deposited over the various blanket layers of the dummy gate structure 310. The mask layer may be patterned using a series of photolithography and etching processes and then transferred to the blanket layers using any suitable etching processes to form the dummy gate structure 310. The dummy gate structure 310 traverses or covers a portion, e.g., the channel region 311, of the fin 304, where a longitudinal direction of the dummy gate structure 310 (e.g., the Y axis along the line B-B of FIG. 1) is substantially perpendicular to the longitudinal direction of the fins 304 (e.g., the X axis along the line A-A of FIG. 1).

Referring to FIG. 5, after forming the dummy gate structures 310, the method 200 forms gate spacers 320 to surround (e.g., along and contacting the sidewalls of) each of the dummy gate structures 310. It should be understood that any number of gate spacers can be formed around the dummy gate structures 310 while remaining within the scope of the present disclosure. The gate spacers 320 may include any suitable dielectric material, such as silicon nitride, silicon oxynitride, silicon carbonitride, a low-k material described above, the like, or combinations thereof. The gate spacers 320 may be formed by first conformally depositing a dielectric layer over the dummy gate structures 310 using any suitable deposition process, such as thermal oxidation, CVD, or the like, and subsequently removing portions of the dielectric layer using a suitable etching process (e.g., a directional or anisotropic dry etching process), leaving the gate spacer 320 along opposite sidewalls of the dummy gate structures 310.

In some embodiments, the method 200 forms a number of lightly doped drain (LDD; not depicted) regions in the device 300 after forming the dummy gate structures 310 and before forming the gate spacers 320. The LDD regions may be formed by applying a plasma doping process to portions of the fin 304 adjacent each of the dummy gate structures 310 (e.g., in their respective source/drain regions). The plasma doping process may include forming a patterned mask (not depicted), such as a patterned photoresist, to cover the regions of the device 300 that are to be protected from the plasma doping process. Portions of the LDD regions may extend under the dummy gate structure 310 and into the channel region 311. In some examples, the LDD regions may be formed after the gate spacers 320 are formed. In some embodiments, the LDD regions are omitted from the device 300.

Figure 9:
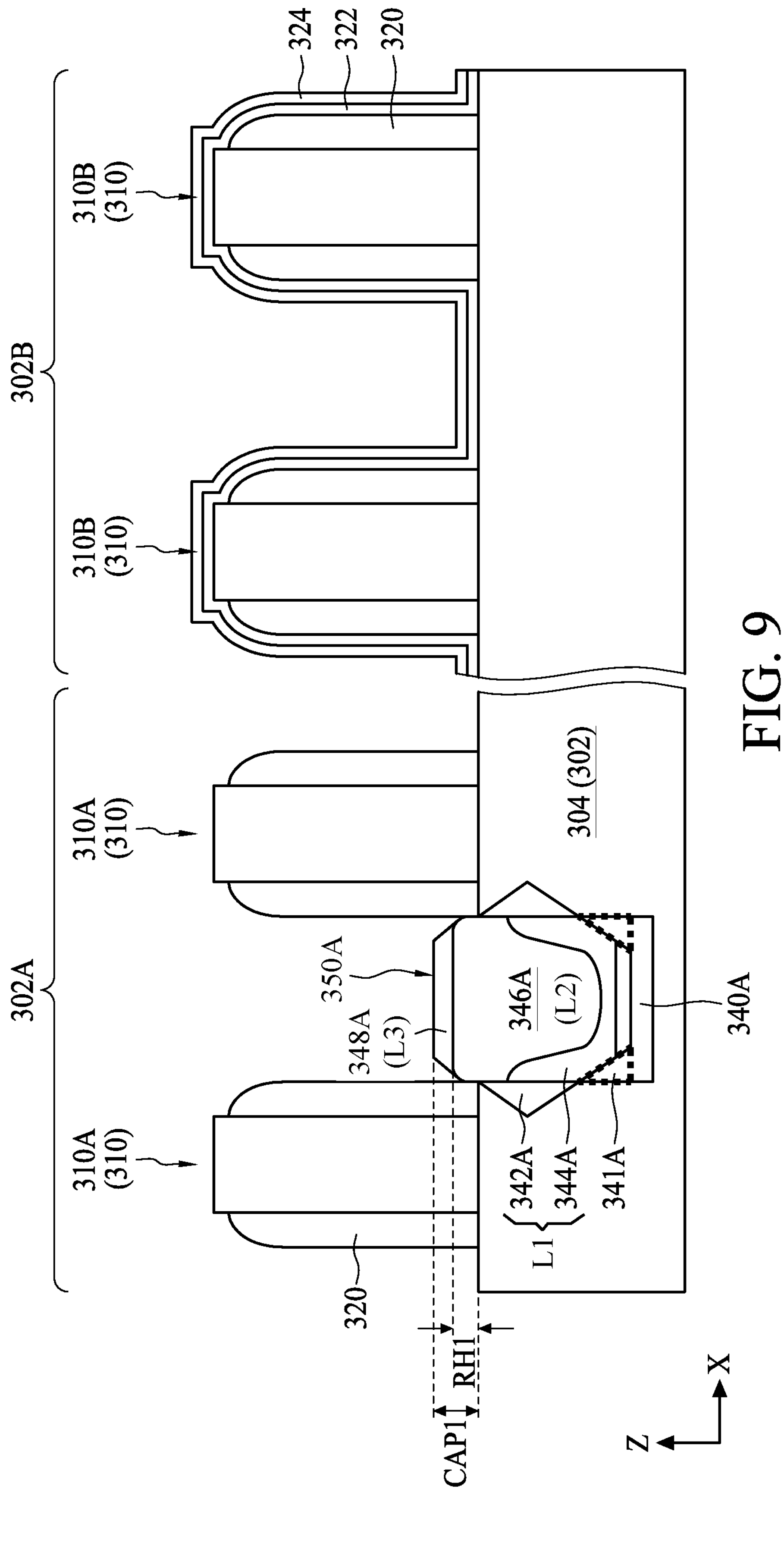
Figure 13:
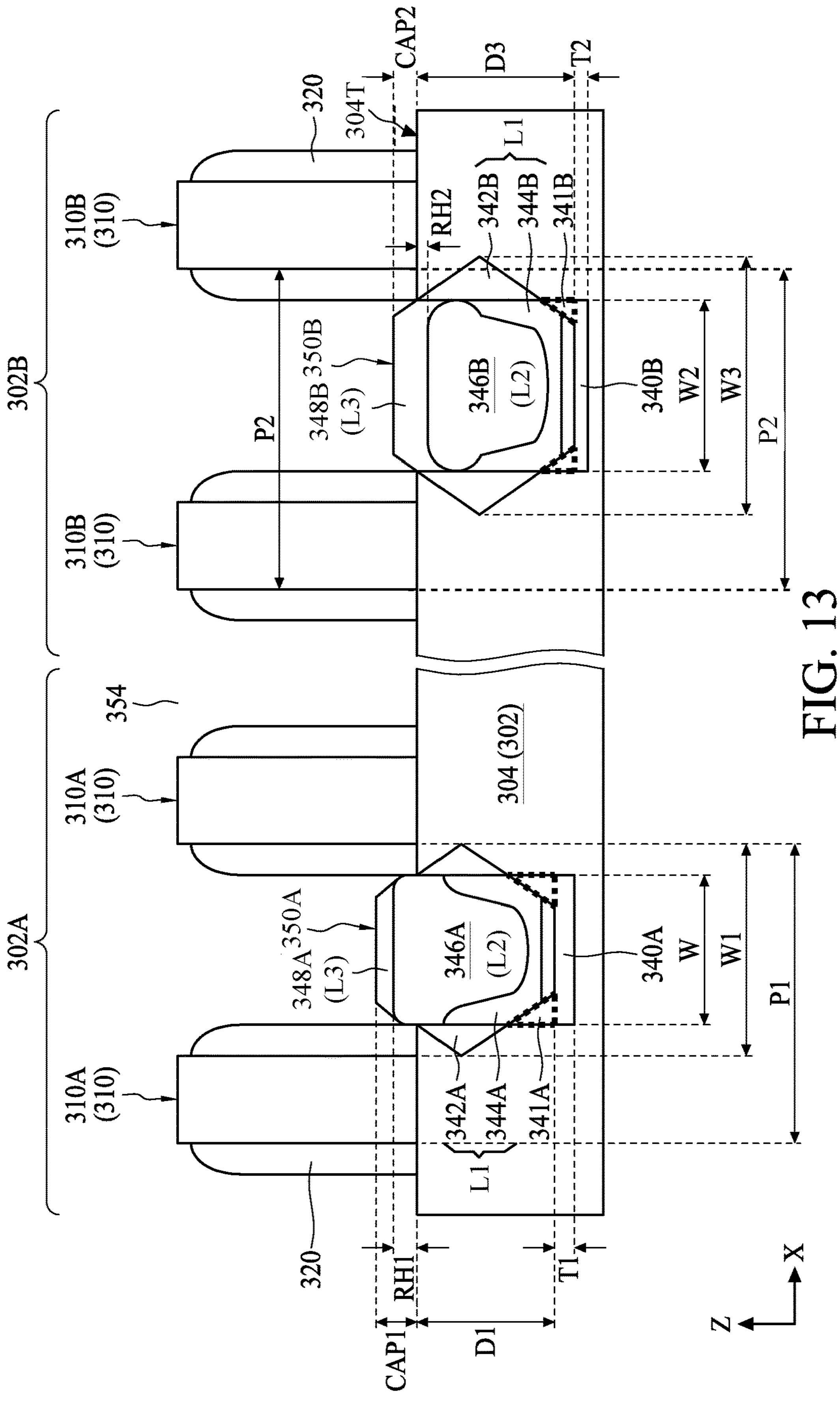

Referring to FIG. 2A, the method 200 proceeds to operation 210 by forming a first source/drain (S/D) feature (or S/D structure, epitaxial structure, etc.) 350A in the first region 302A, as shown in FIG. 9, and a second S/D feature 350B in the second region 302B, as shown in FIG. 13, over the fin 304 (or the substrate 302). The first S/D feature 350A and the second S/D feature 350B are formed by method 250 as depicted in FIGS. 2B and 2C collectively.

Referring to FIGS. 2B and 5, the method 250 at operation 252 forms a patterned mask 326 over the second region 302B to expose the first region 302A. In some embodiments, as depicted, an adhesion layer 322 and a protective layer (e.g., a hard mask) 324 are conformally deposited over the dummy gate structures 310 in this order. The adhesion layer 322 may include any suitable dielectric material, such as an oxide, and is configured to improve bonding between the protective layer 324 and/or the patterned mask 326. The protective layer 324 may include any suitable dielectric material, such as a nitride, and is configured to reduce or prevent inadvertent damage (e.g., from etching or unintended epitaxial growth) to the underlying features (e.g., the dummy gate structures 310) during the subsequent operations and to provide control of dimensions (e.g., critical dimensions or CDs) during the subsequent etching processes. In this regard, the protective layer 324 has a composition different from at least that of the adhesion layer 322, resulting in etching selectivity therebetween. In some examples, the adhesion layer 322 may include silicon oxide and the protective layer 324 may include silicon nitride. The adhesion layer 322 and the protective layer 324 may each be conformally deposited by any suitable process, such as ALD, CVD, PVD, the like, or combinations thereof.

Subsequently, the adhesion layer 322 and the protective layer 324 are patterned to remain over only the second region 302B using a series of photolithography and etching processes such as those described above with respect to forming the fins 304. For example, patterning the adhesion layer 322 and the protective layer 324 includes depositing a photoresist material over the substrate 302, exposing the photoresist material, and develop the photoresist material to remove a portion thereof to form the patterned mask 326. The patterned mask 326 exposes the first dummy gate structures 310A in the first region 302A without exposing the second dummy gate structures 310B in the second region 302B. The adhesion layer 322 and the protective layer 324 are then etched using the patterned mask 326 as an etching mask to expose the first region 302A to the subsequent operations.

Still referring to FIGS. 2B and 5, the method 250 at operation 254 forms a first S/D recess 330A in a portion of the fin 304 (or the substrate 302 if the fin 304 is omitted from the device 300, such as in a planar FET) in the first region 302A. In the present embodiments the first S/D recess 330A has a depth D1, which is measured from a bottom surface of the first S/D recess 330A to the top surface 304T of the fin 304. As will be discussed in detail below, the depth D1 may vary according to a composition (e.g., concentration of germanium) of the subsequently formed first S/D feature 350A.

The first S/D recess 330A is formed adjacent to the first dummy gate structure 310A (e.g., between two adjacent first dummy gate structures 310A as depicted) by any suitable etching process. In some embodiments, the first S/D recess 330A is formed by performing a suitable etching process, such as a dry etching process. For example, the recesses may be formed by an anisotropic dry etching process using the first dummy gate structures 310A (and the gate spacers 320) as an etching mask. The depth D1 of the first S/D recess 330A may be controlled by changing one or more parameters of the etching process. For example, the depth D1 may be controlled by adjusting duration of the etching process, power of a source of plasma applied during the etching process, and/or other suitable parameters, until a desired depth D1 is reached. The depth D1 may range from about 10 nm to about 200 nm, according to some examples.

Subsequently, referring to FIGS. 2B and 5, the method 250 at operation 256 performs a first implantation process 402 to form a first doped layer (or first doped region) 340A in a top portion of the fin 304 exposed in the first S/D recess 330A. In this regard, a depth (or a position) at which the first doped layer 340A is formed corresponds to the depth D1 of the first S/D recess 330A.

The first doped layer 340A may include a suitable dopant corresponding to the type of device formed from the first S/D feature 350A. For example, if the first S/D feature 350A is configured to form a P-type device (e.g., a planar P-type MOSFET, a P-type FinFET, etc.), the first doped layer 340A includes a P-type dopant, such as boron (or another P-type dopant described above). Similarly, if the first S/D feature 350A is configured to form an N-type device (or NMOS device, such as a planar N-type MOSFET, an N-type FinFET, etc.), the first doped layer 340A includes an N-type dopant, such as phosphorous (and/or another N-type dopant described above). In the present embodiments, the first S/D feature 350A is configured to form a P-type device and the first doped layer 340A includes boron. For purposes of illustration, boron will be used as the example dopant for the description of the remainder of the method 250 and method 200.

The first doped layer 340A may be formed by any suitable process, such as an implantation (e.g., an ion implantation) process or a diffusion process. In the present embodiments, the first doped layer 340A is formed by implanting boron in the first S/D recess 330A. Various parameters of the implantation process, such as implantation (or doping) energy, may be adjusted based on the depth D1 at which the first doped layer 340A is formed.

In some embodiments, the first doped layer 340A includes boron at a concentration C1. In some embodiments, the concentration C1 and the depth D1 have a generally negative correlation. For example, if the concentration C1 increases, then the depth D1 would decrease, i.e., the first doped layer 340A would be formed at a position closer to the top surface 304T of the fin 304 and a size of the first S/D feature 350A would also decrease. In some embodiments, the concentration C1 and a thickness T1 of the first doped layer 340A have a generally positive correlation. For example, if the concentration C1 increases, then the thickness T1 would also increase, which may account for the diffusion of boron within the first doped layer 340A.

Figure 6:
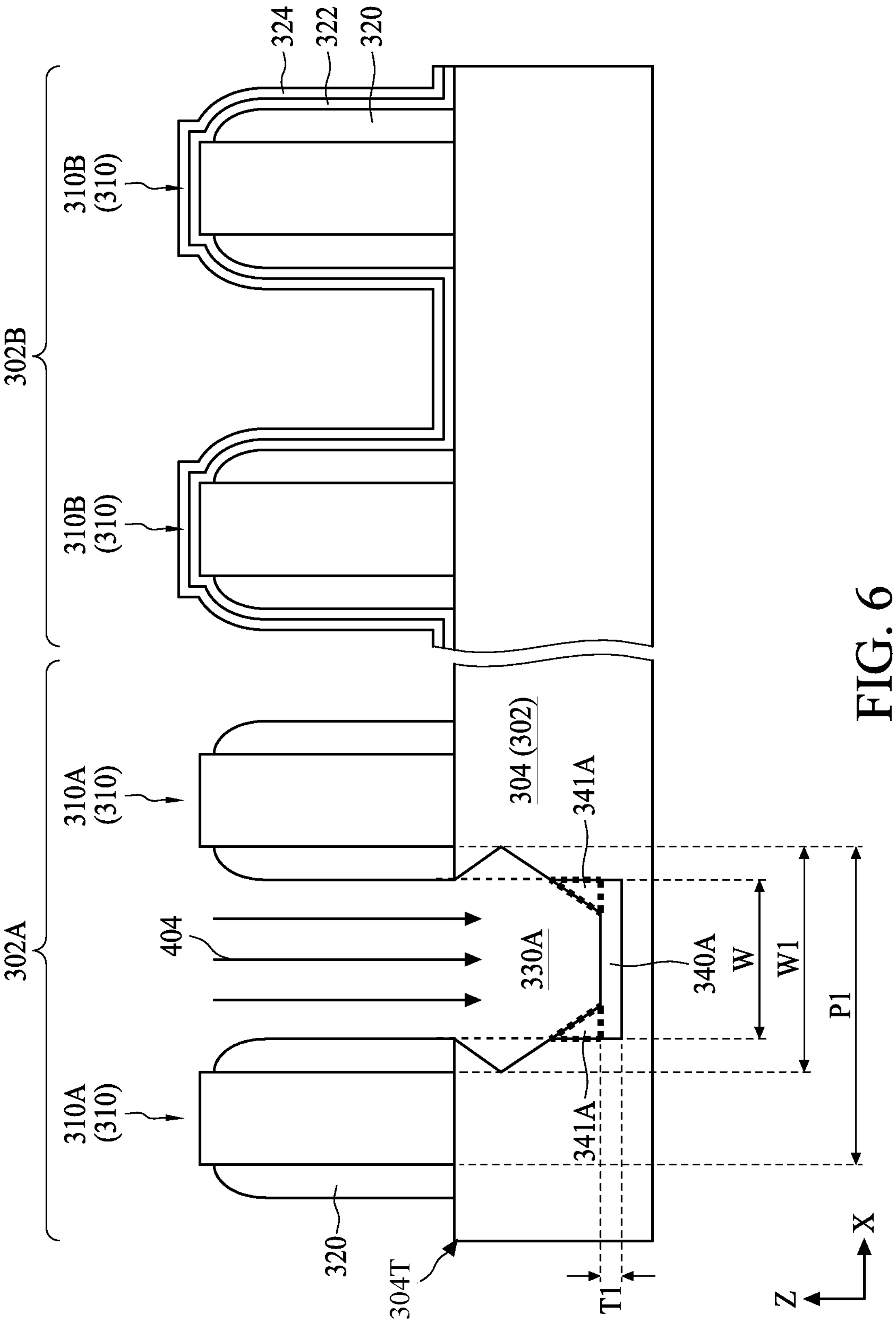

In some instances, as depicted in FIG. 6, boron may diffuse (e.g., diffuse vertically along the Z axis) in the fin 304 (or the substrate 302) along sidewalls of the first S/D recess 330A to form diffusion regions 341A connected to the first doped layer 340A. In some embodiments, a depth D2, which is measured from a bottom surface of the first doped layer 340A to the top surface 304T of the fin 304, accounts for both the depth D1 and the thickness T1 and can be used to indicate the position of the first doped layer 340A. In some embodiments, the first doped layer 340A is formed to a width W along the X axis, which is a width of the S/D recess 330A. In some embodiments, due to diffusion (e.g., lateral diffusion) of boron along the X axis, for example, the first doped layer 340A is formed to a width F1 that is greater than the width W. For purposes of simplicity, the subsequent description of the present disclosure is directed to the embodiments in which the first doped layer 340A having the width W.

Referring to FIGS. 2B and 6, the method 250 at operation 258 performs a first wet etching process 404 to laterally expand the first S/D recess 330A along the X axis. The first wet etching process 404 is implemented using a wet etchant that selectively removes portions of the fin 304 (or the substrate 302) without removing, or substantially removing, portions of the gate spacers 320, the first dummy gate structures 310A, and the first doped layer 340A. After performing the first wet etching process 404, the patterned mask 326 is removed from the device 300 by any suitable process, such as plasma ashing or resist stripping.

The first wet etching process 404 defines a width W1 of the widest portion of the first S/D recess 330A, where the width W1 is greater than the width W measured across a top opening of the first S/D recess 330A. In this regard, a profile of the sidewalls of the etched first S/D recess 304A is pointed away from an interior of the first S/D recess 330A. It is noted that the profile of the sidewalls may have any other shape so long as a portion of the first S/D recess 330A is widened with respect to its top opening.

In some embodiments, the width W1 can be adjusted by controlling parameters of the first wet etching process 404, such as concentration of the wet etchant, duration of the etching process, dimensions (e.g., the depth D1) of the first S/D recess 330A. For example, the widths W and W1 are positively correlated, such that a larger width W leads to a larger width W1. In some embodiments, both the width W and the width W1 are controlled by adjusting a pitch P1 between two adjacent first dummy gate structures 310A, which is a CD of the device 300 that describes a separation distance between the two adjacent first dummy gate structures 310A. In this regard, a larger pitch P1 corresponds to a larger width W, which allows a greater amount of wet etchant to interact with the material exposed in the first S/D recess 330A, leading to a larger depth D1 and a larger width W1. In some embodiments, the width W1 is also referred to as a tip-to-tip distance of the first S/D feature 350A. The width W1 may range from about 20 nm to about 150 nm, according to some examples.

Referring to FIGS. 2B and 7A-9 collectively, the method 250 forms epitaxial layers 342A, 344A, 346A, and 348A over the first doped layer 340A in the first S/D recess 330A. In the present embodiments, the epitaxial layers 342A and 344A (i.e., collectively a first epitaxial layer, or L1, of the first S/D feature 350A), 346A (i.e., a second epitaxial layer, or L2, of the first S/D feature 350A), and 348A (i.e., a third epitaxial layer, or L3, of the first S/D feature 350A) have compositions that differ from one another. For example, in the present embodiments, because the first S/D feature 350A is configured to form a P-type device, the epitaxial layers 342A, 344A, and 346A each include silicon germanium (SiGe) doped with a P-type dopant, such as boron, but may differ in a concentration of germanium included. Alternatively, the epitaxial layers 342A, 344A, and 346A may each include silicon (Si) doped with an N-type dopant, such as phosphorous and/or arsenic, to form an N-type device.

Figure 7A:
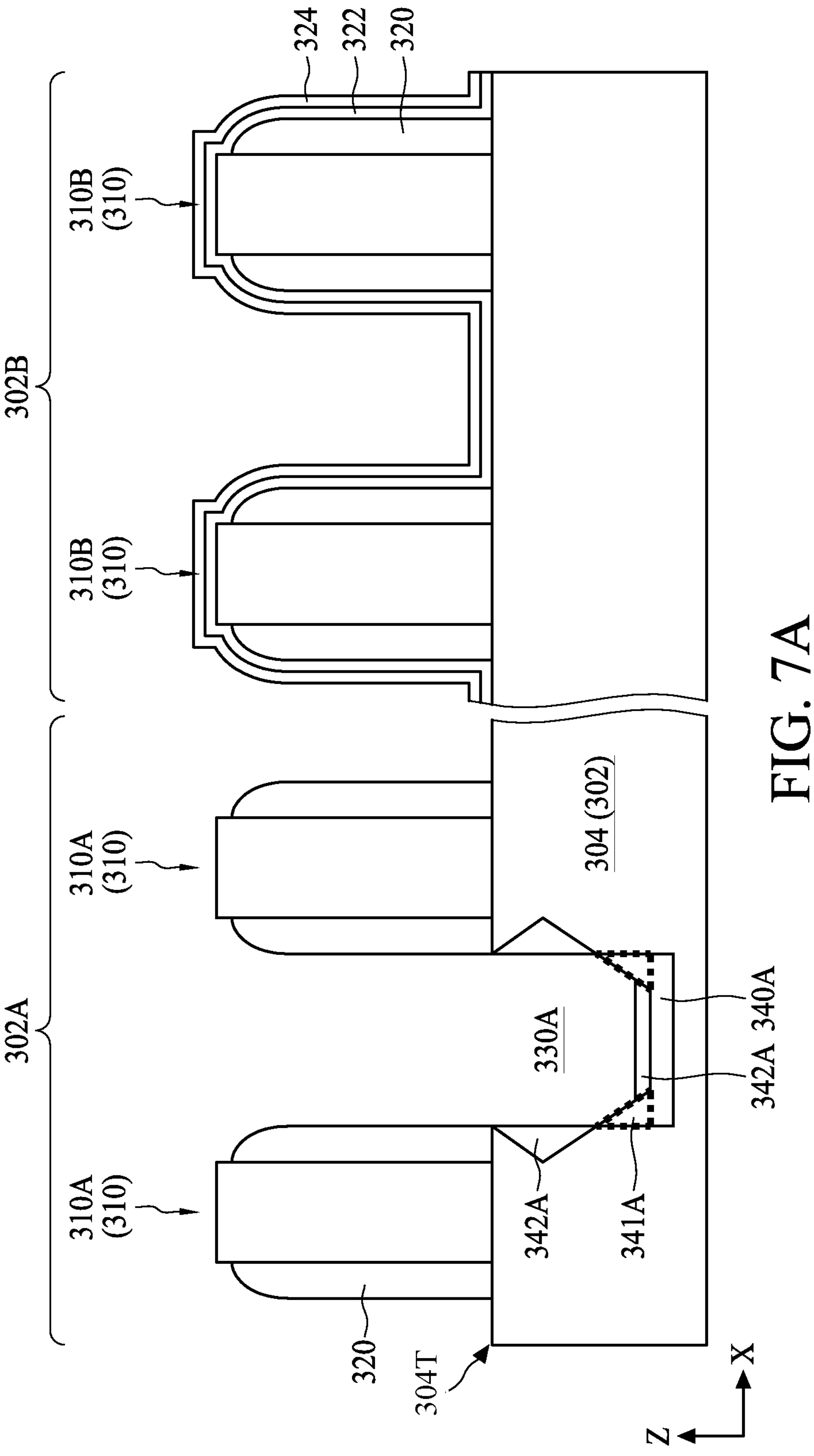
Figure 7B:
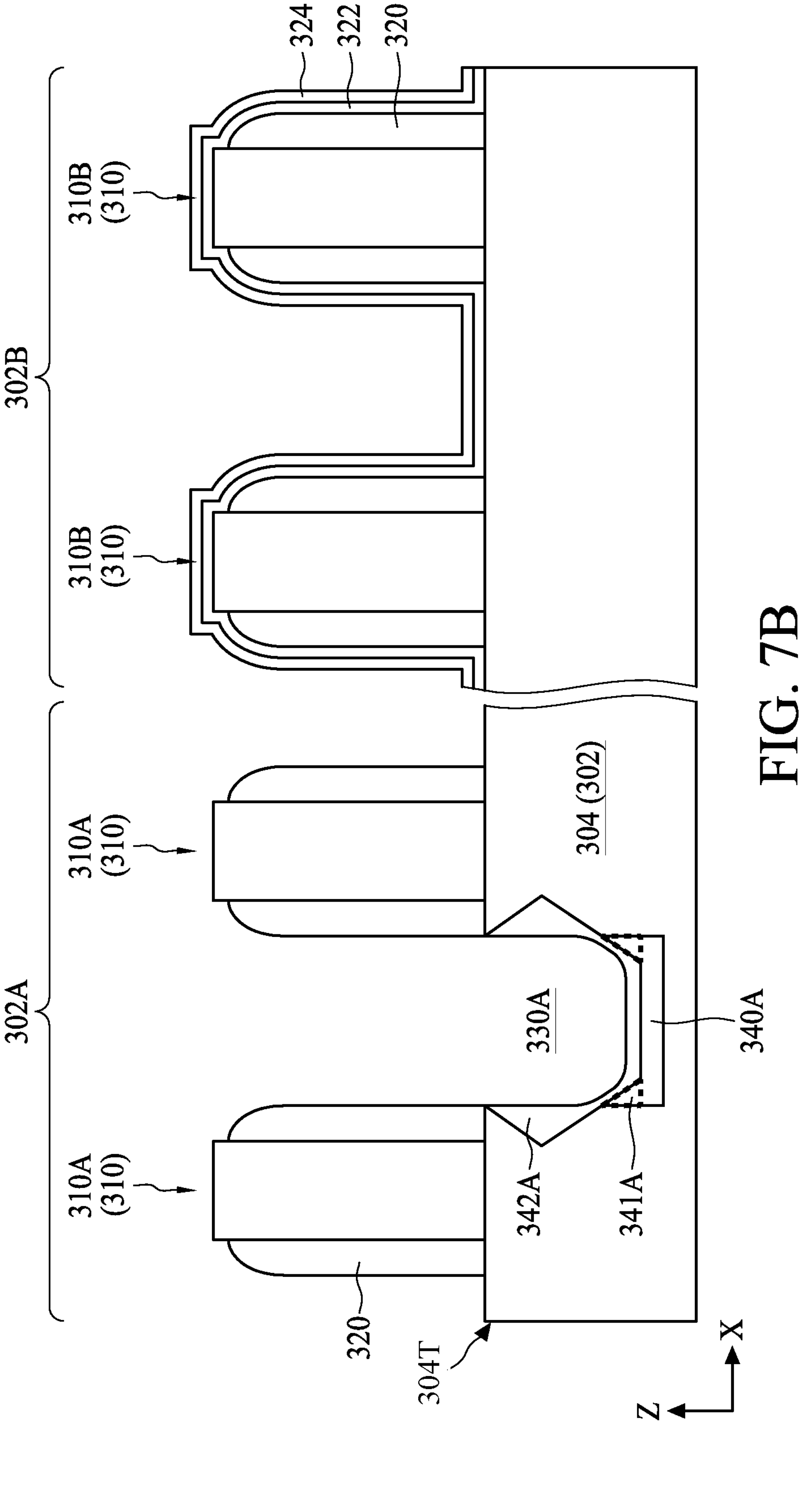

Referring to FIGS. 2B and 7A, the method 250 at operation 260 forms (or grows) the epitaxial layer 342A from a bottom surface and the sidewalls of the first S/D recess 330A without completely filling the first S/D recess 330A. In some embodiments, the epitaxial layer 342A is formed by filling the first S/D recess 330A with an epitaxial material and then etching the epitaxial material. In some embodiments, the epitaxial layer 342A is a first sub-layer of the first epitaxial layer L1 of the first S/D feature 350A and serves as a transitional or interfacial epitaxial layer for facilitating the growth of the subsequent epitaxial layer 344A. In the present embodiments, the epitaxial layer 342A includes germanium at a concentration G1 (in atomic percent, or at %, for example). The epitaxial layer 342A may be formed by any suitable process, such as metal-organic CVD (MOCVD), molecular beam epitaxy (MBE), liquid phase epitaxy (LPE), vapor phase epitaxy (VPE), selective epitaxial growth (SEG), the like, or combinations thereof. In the present embodiments, the bottom surface of the epitaxial layer 342A is in direct contact with the first doped layer 340A. Furthermore, depending on the extend of diffusion of boron, referring to FIG. 7B, portions of sidewalls (e.g., along a slanted facet) of the epitaxial layer 342A may be in direct contact with the diffusion regions 341A.

Figure 8:
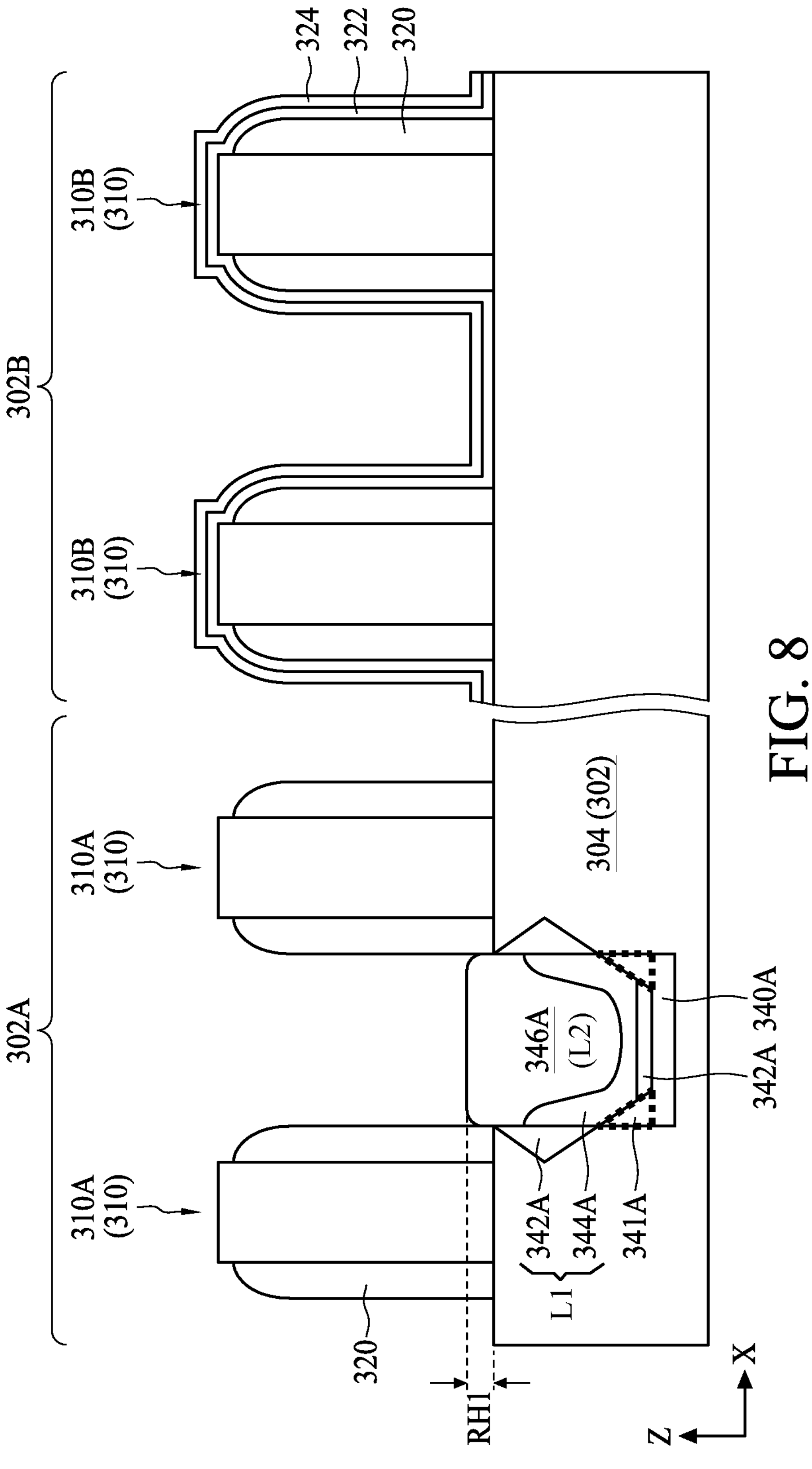

Referring to FIGS. 2B and 8, the method 250 at operation 260 subsequently forms the epitaxial layer 344A, which is a second sub-layer of the first epitaxial layer L1 of the first S/D feature 350A of FIG. 9, over the epitaxial layer 342A. In the present embodiments, the epitaxial layer 344A includes germanium at a concentration G2. In some embodiments, the concentrations G1 and G2 are substantially the same. In some embodiments, the concentration G2 is greater than the concentration G1. In the present embodiments, the epitaxial layer 344A is formed to directly contact each facet (or surface) of the epitaxial layer 342A. The epitaxial layer 344A may be formed using the same process as that described above with respect to the epitaxial layer 342A.

Still referring to FIGS. 2B and 8, the method 250 at operation 262 forms the epitaxial layer 346A, which is the second epitaxial layer L2 of the first S/D feature 350A of FIG. 9, over the epitaxial layer 344A. The epitaxial layer 346A has a raised height RH1, which is measured from the top surface 304T of the fin 304 to a top surface of the epitaxial layer 346A. In some embodiments, a top portion of the epitaxial layer 346A grows to protrude from the top surface 304T of the fin 304, such that the raised height RH1 is a positive value (i.e., greater than zero). In some embodiments, the top portion of the epitaxial layer 346A is below the top surface 304T of the fin 304, such that the raised height RH1 is a negative value (i.e., less than zero). The raised height RH1 may range from about −40 nm to about 40 nm, according to some examples.

In the present embodiments, the epitaxial layer 346A includes germanium at a concentration G3, which is higher than the concentrations G1 and G2. In some embodiments, the concentration G1 and the concentration G2 are each about 20 at % to about 30 at %, and the concentration G3 is about 50 at % to about 60 at %. In various embodiments, due to lattice mismatch between silicon (i.e., in the fin 304 or the substrate 302) and silicon germanium (i.e., in the epitaxial layer 346A), the relatively higher germanium concentration G3 induces compressive strain in the corresponding channel region 311, which increases a current in the channel region 311 for improved device performance (e.g., higher device speed). However, an increase in the amount of germanium can also increase a concentration gradient of germanium between the epitaxial layer 346A and the substrate 302 (and the fin 304), increasing a driving force for diffusion of germanium towards substrate 302 and potentially causing leakage issues.

In the present embodiments, the first doped layer 340A serves as a barrier layer for reducing or preventing diffusion of germanium from at least the epitaxial layer 346A into the substrate 302. In this regard, the extent of such barrier against diffusion is determined based on the concentration C1 of boron included in the first doped layer 340A. In the present embodiments, the concentration G3 and the concentration C1 are tuned to have a generally positive correlation. For example, an increase in the concentration G3 corresponds to an increase in the concentration C1 provided in the first doped layer 340A. In some embodiments, the position of the first doped layer 340A as the diffusion barrier layer against germanium is determined based on the depth D1 of the first S/D recess 330A as described above.

Referring to FIGS. 2B and 9, the method 250 at operation 264 forms the epitaxial layer 348A, which is the third epitaxial layer L3 of the first S/D feature 350A, over the epitaxial layer 346A to complete formation of the first S/D feature 350A. In the present embodiments, the epitaxial layer 348A includes a silicon-based capping layer to be consumed during a subsequent silicidation process. In this regard, the epitaxial layer 348A is free, or substantially free, from any germanium. The epitaxial layer 348A has a height CAP1 measured from the top surface 304T of the fin 304 to a top surface of the epitaxial layer 348A. In this regard, the height CAP1 is also correlated with the raised height RH1 of the epitaxial layer 346A.

In various embodiments, the resulting first S/D feature 350A is doped with a suitable dopant, such as boron. The dopant may be introduced by an in situ doping process while growing each of the epitaxial layers 342A, 344A and 346A. Alternatively, the dopant may be introduced by an implantation process after forming the epitaxial layers 342A, 344A and 346A. An annealing process may be applied after doping the epitaxial layers 342A, 344A and 346A to activate the dopant.

After completing the formation of the first S/D feature 350A in the first region 302A, referring to FIG. 2C, the method 250 proceeds to forming the second S/D feature 350B in the second region 302B at operations 266-278. Although the method 250 forms the first S/D feature 350A before forming the second S/D feature 350B, the present disclosure does not limit the order in which the S/D features are formed. For example, the second S/D feature 350B, as described below, may be formed before forming the first S/D feature 350A.

Figure 10:
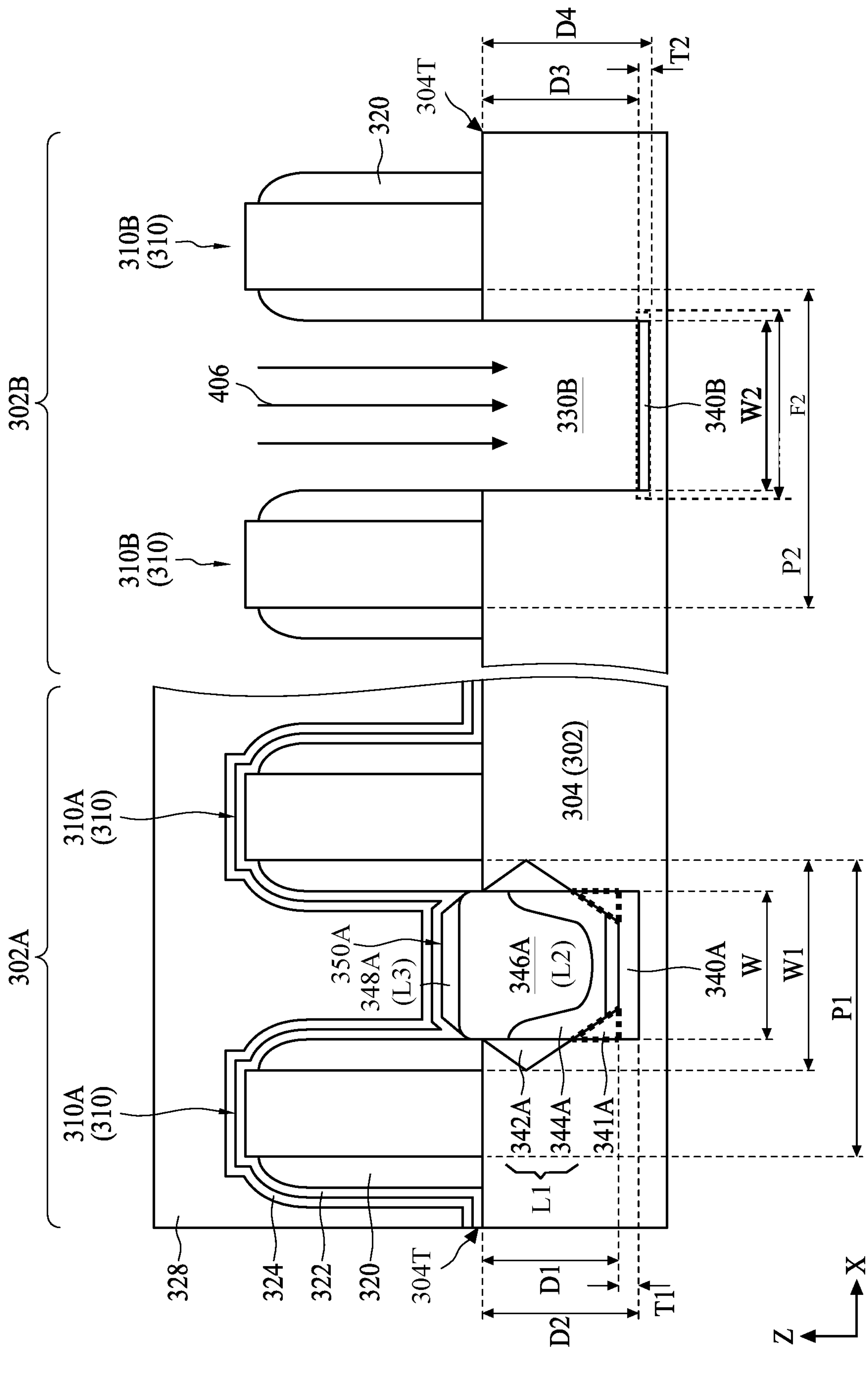

Referring to FIGS. 2C and 10, the method 250 at operation 266 forms a patterned mask 328 over the first region 302A to expose the second region 302B in a process similar to the operation 252 described above with respect to FIG. 5. For example, the adhesion layer 322 and the protective layer 324 are conformally deposited over the device 300, including the first S/D feature 350A, and subsequently patterned using the patterned mask 328 to expose the second region 302B.

Subsequently, the method 250 at operation 268 forms a second S/D recess 330B in a portion of the fin 304 in the second region 302B. The second S/D recess 330B may be formed in a manner similar to that described above with respect to forming the first S/D recess 330A. For example, the second S/D recess 330B may be formed by performing a dry etching process using the adjacent second dummy gate structures 310B as an etching mask.

In the present embodiments, the second S/D recess 330B has a width W2 across its top opening and a depth D3 measured from a bottom surface of the second S/D recess 330B to the top surface 304T of the fin 304. By adjusting at least a pitch P2 of the two adjacent second dummy gate structures 310B, the width W2, the depth D3, or both, can be adjusted, similar to that described above with respect to the first S/D recess 330A. In the present embodiments, the width W2, the depth D3, or both, are configured to be different from the width W1 and the depth D1, respectively. Referring to FIG. 10, the pitch P2 is greater than the pitch P1, and the width W2 is greater than the width W. Furthermore, the depth D3 of the second S/D recess 330B is configured to be greater than the depth D1 by controlling the dry etching process to remove a greater amount of the fin 304 relative to the forming of the first S/D recess 330A.

Subsequently, the method 250 at operation 270 performs a second implantation process 406 to form a second doped layer 340B in a top portion of the fin 304 (or the substrate 302) exposed in the second S/D recess 330B. In this regard, a depth (or a position) at which the second doped layer 340B is formed corresponds to the depth D3 of the second S/D recess 330B, which is greater than the depth D1 of the first S/D recess 330A (or the first S/D feature 350A). In other words, the second doped layer 340B is positioned below the first doped layer 340A, according to the present embodiments.

The second doped layer 340B is similar to the first doped layer 340A in that they include the same dopant, such as boron in the present embodiments where the second S/D feature 350B is configured to provide a P-type device. Alternatively, the second doped layer 340B may include phosphorous and/or arsenic in embodiments where the second S/D feature 350B is configured to provide an N-type device. In some embodiments, the second doped layer 340B is formed by implementing an implantation process similar to that described above with respect to forming the first doped layer 340A.

Figure 11:
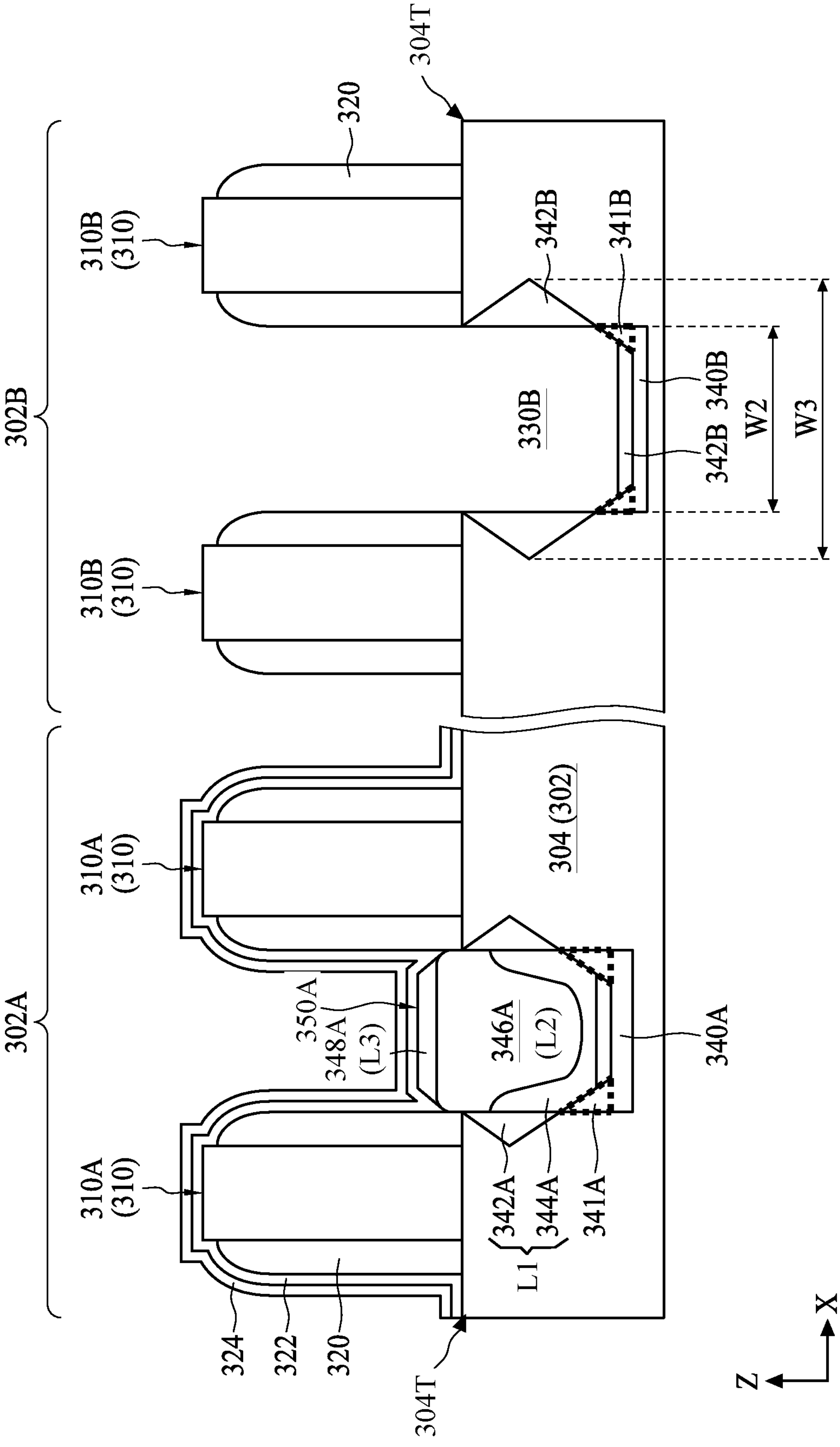

In this regard, the second doped layer 340B is generally configured as a barrier layer to reduce or prevent germanium in the second S/D feature 350B from diffusing out of the subsequently formed epitaxial layers in the second S/D recess 330B into the substrate 302. However, different from the first doped layer 340A, the second doped layer 340B includes boron at a concentration C2 that is less than the concentration C1. Such a difference in concentration causes a thickness T2 of the second doped layer 340B to also be less than the thickness T1, according to the generally positive correlation between the concentration and the thickness described above. Similar to the first doped layer 340A, as depicted in FIG. 11, boron may diffuse (e.g., diffuse vertically along the Z axis) in the fin 304 (or the substrate 302) along sidewalls of the second S/D recess 330B to form diffusion regions 341B connected to the second doped layer 340B. In some embodiments, due to diffusion (e.g., lateral diffusion) of boron along the X axis, for example, the second doped layer 340B is formed to a width F2 that is greater than the width W2. For purposes of simplicity, the subsequent description of the present disclosure is directed to the embodiments in which the second doped layer 340B having the width W2.

In the present embodiments, a depth D4, which is measured from a bottom surface of the second doped layer 340B to the top surface 304T of the fin 304, accounts for both the depth D3 and the thickness T2 and can be used to indicate the position of the second doped layer 340B. Depending upon the difference between the depths D1 and D3 as well as the difference between the thicknesses T1 and T2 (i.e., the difference between the concentrations C1 and C2), the depths D2 and D4 may be substantially the same or different in value, and may each range from about 30 nm to about 300 nm, according to some examples. For example, if the difference between the depths D1 and D3 (where D1<D3) is greater than the difference between the thickness T1 and T2 (where T1>T2), then the depth D4 is greater than the depth D2, and vice versa. In some embodiments, the second doped layer 340B is formed to the width W2 of the S/D recess 330B.

Referring to FIGS. 2C and 11, the method 250 at operation 272 performs a second wet etching process (not depicted) to laterally expand the second S/D recess 330B along the X axis. The second wet etching process is implemented using a wet etchant similar to that used in the first wet etching process 404. The second wet etching process defines a width W3 of the widest portion of the second S/D recess 330B, where the width W3 is greater than the width W2. The width W3 may be tuned in a manner similar to the width W1 described in detail above.

Figure 12:
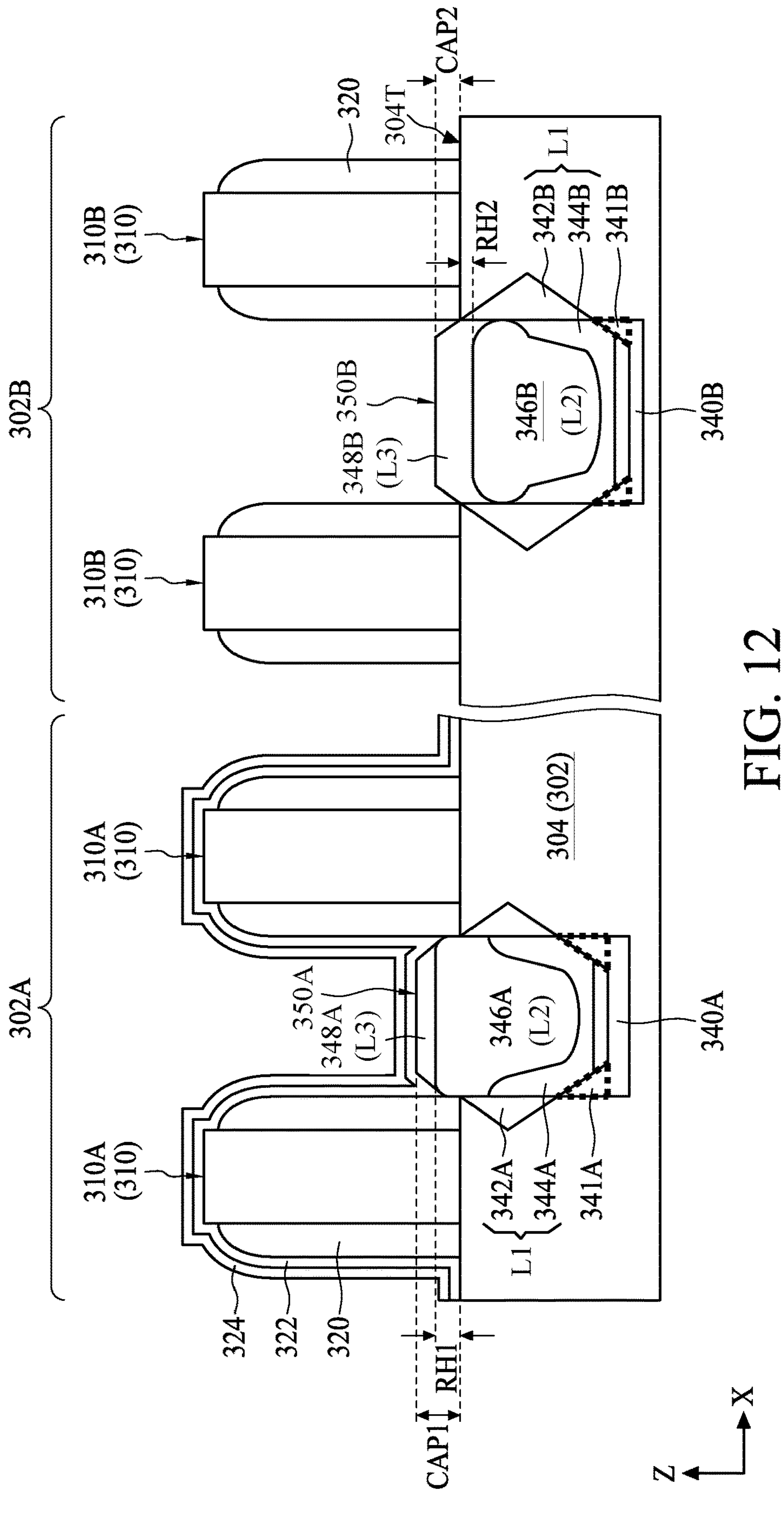

Referring to FIGS. 2C, 11, and 12 collectively, the method 250 at operations 274-278 forms the second S/D feature 350B that includes epitaxial layers 342B, 344B, 346B, and 348B, over the second doped layer 340B. In the present embodiments, the functions of the epitaxial layers 342B, 344B, 346B, and 348B of the second S/D feature 350B are similar or analogous to those of the epitaxial layers 342A, 344A, 346A, and 348A of the first S/D feature 350A, respectively. For example, the epitaxial layers 342B and 344B are collectively considered a first epitaxial layer, or L1, of the second S/D feature 350B; the epitaxial layer 346B is considered a second epitaxial layer, or L2, of the second S/D feature 350B; and the epitaxial layer 348B is considered a third epitaxial layer, or L3, of the second S/D feature 350B. In the present embodiments, after completing the operation 278 of forming the second S/D feature 350B, the resulting epitaxial layers 342B, 344B, and 346B each including silicon germanium, is doped with a suitable dopant, such as boron, by a process similar to that described above with respect to doping the first S/D feature 350A.

The epitaxial layers 342B, 344B, 346B, and 348B may each be formed in a manner similar to that described above with respect to forming the epitaxial layers 342A, 344A, 346A, and 348A, respectively. In the present embodiments, the epitaxial layers 342B, 344B, and 346B each include silicon germanium (SiGe) doped with a P-type dopant, such as boron, but differ in a concentration of germanium included therein. For example, the epitaxial layers 342B, 344B, and 346B may each include germanium at a concentration G4, G5, and G6, respectively. In the present embodiments, the concentration G6 is tuned to be less than the concentration G3 of the first S/D feature 350A but greater than each of the concentrations G4 and G5. The concentrations G4 and G5 may be the same or different. Furthermore, the epitaxial layer 348B includes a silicon-based capping layer for forming a silicide layer in a subsequent silicidation process.

Referring to FIGS. 10 and 12, due to the depth D3 being greater than the depth D1, a top surface of the epitaxial layer 346B is below the top surface 304T of the fin 304, such that a raised height RH2 of the epitaxial layer 346B (corresponding to the raised height RH1 of the epitaxial layer 346A) is a negative value (i.e., less than zero). The raised height RH2 may range from about −40 nm to about 40 nm, according to some examples. As such, a height CAP2 of the epitaxial layer 348B, which is measured from the top surface 304T of the fin 304 to a top surface of the epitaxial layer 348B and is correlated with the raised height RH2 of the epitaxial layer 346B, is less than the height CAP1.

Referring to FIG. 13, the first S/D feature 350A and the second S/D feature 350B can be tuned to have different profiles by adjusting the relative positions and concentrations of the first doped layer 340A and the second doped layer 340B. For example, by forming the first doped layer 340A closer to the top surface 304T of the fin 304 than the second doped layer 340B, i.e., the depth D3 being greater than the depth D1, the size of the second S/D feature 350B embedded in the fin 304 is greater than that of the first S/D feature 350A, which leads to a higher switch speed in the device formed by the second S/D feature 350B. In various embodiments, the depth of each of S/D features 350A and 350B is also correlated with other profile parameters, such as the raised height RH (a negative correlation) and the width of the widest portion of the S/D feature (a positive correlation). For example, referring to FIG. 13, the second S/D feature 305B has the width W3 that is larger than the width W1, and the raised height RH2 that is less than the raised height RH1.

In various embodiments, the concentrations C1 and C2 of boron in the first doped layer 340A and the second doped layer 340B, respectively, are tuned according to the concentrations of germanium in their corresponding epitaxial layers for improved barrier property against diffusion of germanium to the channel regions of the device 300. For example, referring to FIG. 13, the concentration C1 is tuned to be greater than the concentration C2 as the extent of diffusion of germanium in the first S/D feature 350A, which has a higher concentration G3 of germanium, is greater than that in the second S/D feature 350B, which has a lower concentration G6 of germanium. Furthermore, in some embodiments, too high of a concentration C1 or C2 may also cause diffusion of boron into the channel regions 311 of the device 300, which may negatively affect the device performance. In this regard, the first S/D feature 350A with a higher concentration G3 of germanium and the corresponding first doped layer 340A with a higher concentration C1 of boron are formed at a shallower depth D1 than the second S/D feature 350B, which has a lower concentration G6 of germanium, and the corresponding second doped layer 340B with a lower concentration C2 of boron.

Accordingly, the present disclosure provides a method of independently tuning various parameters of epitaxial formation to achieve S/D features with different profiles and consequently, devices with different performance, over a single substrate. In addition, a doped layer implanted below a S/D feature provides barrier against diffusion of germanium from the S/D feature into a nearby channel region, thereby reducing or preventing leakage in the device.

Referring to FIG. 13, the adhesion layer 322 and the protective layer 324 remaining over the first region 302A are subsequently removed from the device 300 after forming the second S/D feature 350B. The adhesion layer 322 and the protective layer 324 may be removed by any suitable etching process, such as a dry etching process or a wet etching process. In some embodiments, the etching process is selective towards the adhesion layer 322 and the protective layer 324 without removing, or substantially removing, the neighboring components of the device 300.

Figure 14:
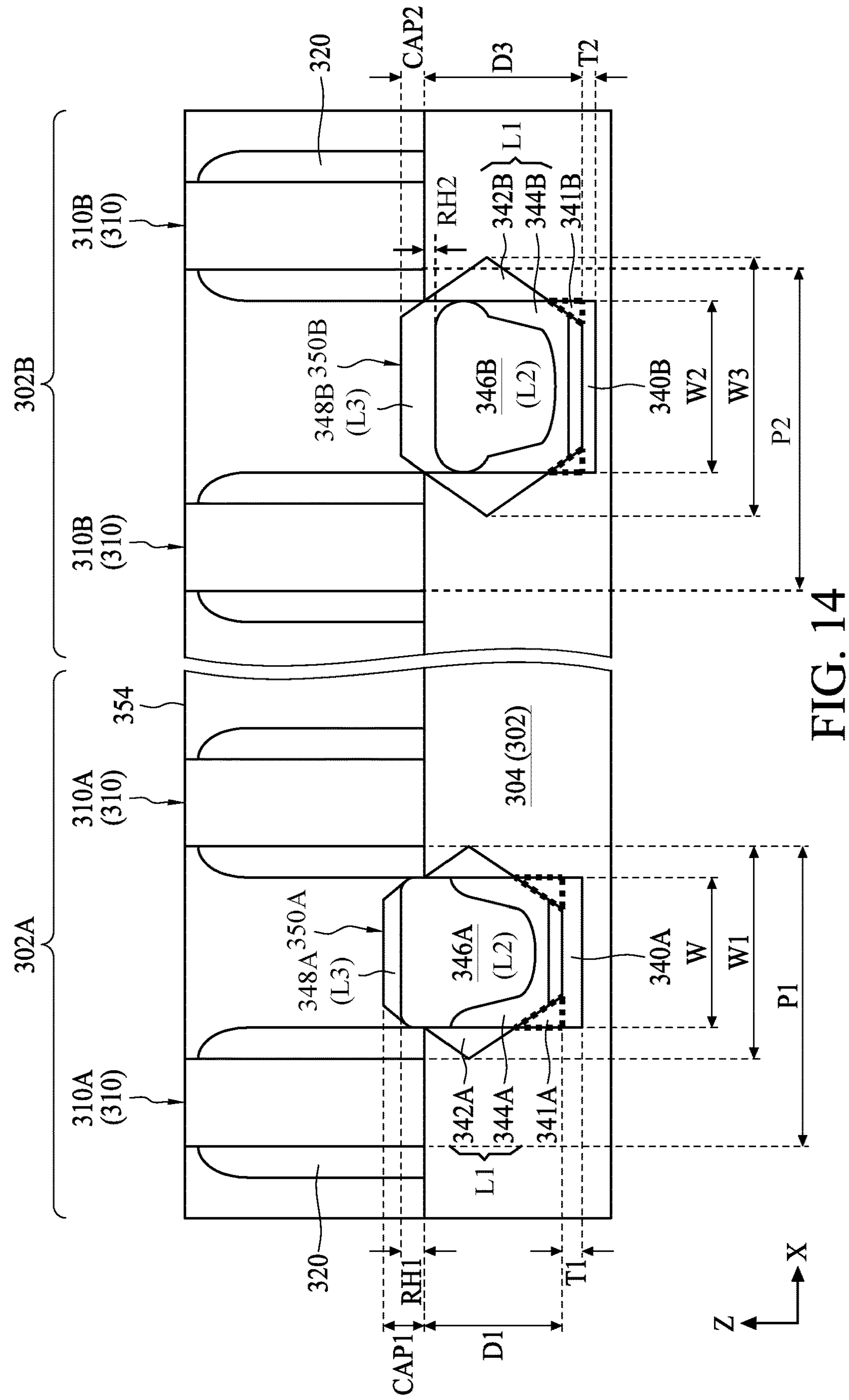

Referring to FIGS. 2A and 14, the method 200 at operation 212 forms an interlayer dielectric (ILD) layer 354 over the device 300. In some embodiments, prior to forming the ILD layer 354, a contact etch stop layer (CESL; not depicted) is formed over the device 300. The ILD layer 354 and CESL include different materials to provide etching selectivity therebetween in subsequent fabrication processes. The CESL may include any suitable dielectric material such as silicon nitride, silicon oxynitride, silicon oxide, the like, or combinations thereof, and may be formed by a suitable formation method such as CVD, ALD, PVD, the like, or combinations thereof. In some embodiments, the ILD layer 354 includes any suitable dielectric material, such as silicon oxide, a low-k dielectric material as described above, the like, or combinations thereof, and may be deposited by any suitable method, such as CVD, PECVD, FCVD, or the like. After the ILD layer 354 is formed, a planarization process, such as a CMP process, may be performed to achieve a leveled top surface for the dielectric layer 347. The CMP process may also remove the mask and portions of the CESL disposed over the dummy gate structures 310. After the planarization process, the top surface of the dielectric layer 347 is substantially coplanar with the top surface of the dummy gate structures 310 as depicted herein. In some embodiments, the dielectric layer 347 is omitted, such that the ILD layer 354, after being planarized, is substantially coplanar with the top surface of the dummy gate structures 310.

Figure 15:
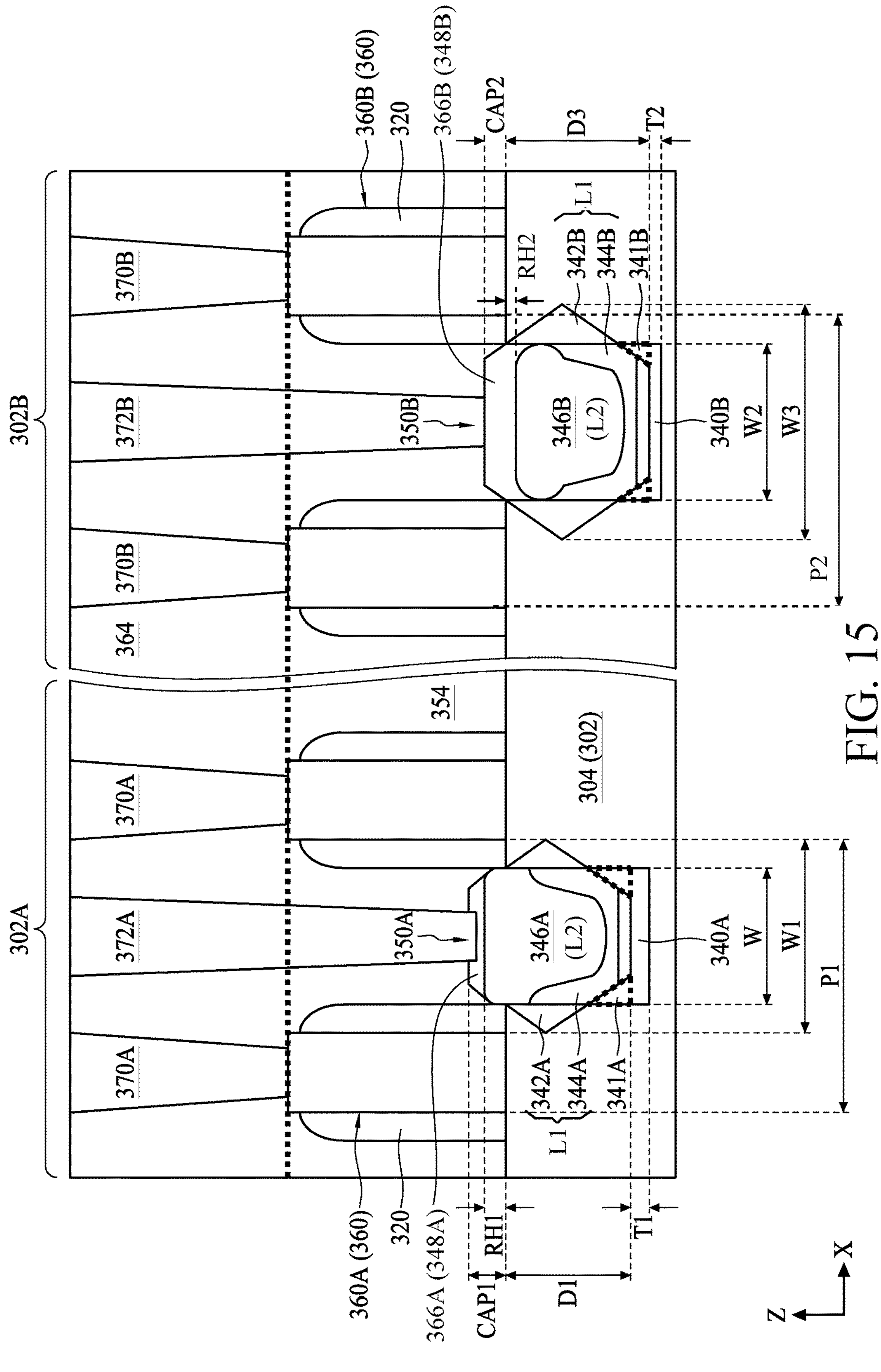

Referring to FIGS. 2A and 15, the method 200 at operation 214 replaces the first dummy gate structures 310A with first metal gate structures 360A and the second dummy gate structures 310B with second metal gate structures 360B. For purposes of simplicity in certain portions of the present disclosure, the first metal gate structures 360A and second metal gate structures 360B are collectively referred to as the metal gate structures 360.

Replacing the dummy gate structures 310 includes first removing the dummy gate structures 310 to form gate trenches (not depicted) between the gate spacers 320. In some embodiments, the dummy gate structures 310 are removed by one or more etching steps between the respective gate spacers 320 to expose the channel region 311 of the fin 304. In some embodiments, the dummy gate dielectric layer (not depicted) may be used as an etch stop layer when the dummy gate electrode is etched. The dummy gate dielectric layer may then be removed after the removal of the dummy gate electrode. In some examples, top portions of the gate spacers 320 may be removed (or shortened) by a suitable etching process to expose top portions of the ILD layer 354.

Referring to FIGS. 2A and 15, the method 200 forms the metal gate structures 360 in the gate trench. The first metal gate structures 360A are formed adjacent to the first S/D feature 350A in the first region 302A and the second metal gate structures 360B are formed adjacent to the second S/D feature 350B in the second region 302B. In some embodiments, forming the metal gate structure 360 includes conformally depositing a gate dielectric layer (not depicted separately) in the gate trench. The gate dielectric layer may include any suitable dielectric material, such as silicon oxide, silicon nitride, a high-k dielectric material (i.e., having a dielectric constant greater than that of silicon oxide, which is about 3.9), the like, or combinations thereof. The high-k dielectric material may include an oxide or a silicate of Hf, Al, Zr, La, Mg, Ba, Ti, Pb, the like, or combinations thereof. The gate dielectric layer may be formed by any suitable method, such as ALD, CVD, PECVD, molecular beam deposition (MBD), the like, or combinations thereof. In some embodiments, an interfacial layer (not depicted) may be formed in the gate trench before forming the gate dielectric layer. The interfacial layer may include an oxide, such as silicon oxide, and may be formed by any suitable method, such as ALD, CVD, thermal oxidation, chemical oxidation, the like, or combinations thereof.

Subsequently, a gate electrode (not depicted separately) is formed over the gate dielectric layer, resulting in the metal gate structure 360 in the gate trench. The gate electrode may include any suitable metal, such as tungsten (W), copper (Cu), ruthenium (Ru), aluminum (Al), gold (Au), cobalt (Co). The gate electrode may be formed by any suitable method, such as PVD, CVD, electroplating, electroless plating, the like, or combinations thereof, as a blanket layer over the gate dielectric layer and subsequently planarized by a CMP process, for example, to expose a top surface of the gate spacers 320. While not depicted the gate electrode may further include a barrier layer, a seed layer, the like, or combinations thereof. In one example, the barrier layer may include Ti, Ta, TiN, TaN, the like, or combinations thereof, and may be deposited by any suitable method, such as CVD or ALD.

In some embodiments, though not depicted, one or more work function layers may be formed conformally over the gate dielectric layer before forming the gate electrode. The work function layers may include a P-type work function layer, an N-type work function layer, multilayers thereof, or combinations thereof. In the discussion herein, a work function layer may also be referred to as a work function metal. Examples of the work function layers may include TiN, TaN, Ru, Mo, Al, $ZrSi_2$, $MoSi_2$, $TaSi_2$, $NiSi_2$, WN, Ti, Ag, TaAl, TaAlC, TiAlN, TaC, TaCN, TaSiN, Mn, Zr, the like, or combinations thereof. The work function layer(s) may be deposited by CVD, PVD, ALD, the like, or combinations thereof. Additional layers (not depicted) including a capping layer, a glue layer (or an adhesion layer), the like, or combinations thereof may also be formed between the gate dielectric layer and the gate electrode by any suitable method, such as CVD, PVD, ALD, MBD, the like, or combinations thereof. In some embodiments, the capping layer may include silicon, silicon oxide, silicon nitride, the like or combinations thereof. The glue layer may each include Ti, Ta, TiN, TaN, the like, or combinations thereof. In some embodiments, the work function layer(s), the capping layer, the glue layer, and/or the like may each be formed to have a U-shaped configuration over the gate dielectric layer, which is also formed to have a U-shaped configuration.

Still referring to FIGS. 2A and 15, the method 200 at operation 216 forms a first silicide layer 366A over the first S/D feature 350A and a second silicide layer 366B over the second S/D feature 350B. In the present embodiments, forming the first silicide layer 366A and the second silicide layer 366B includes first forming an ILD layer 364 over the ILD layer 354 and subsequently patterning the ILD layers 364 and 354 to form a S/D contact opening (not depicted) over each of the first S/D feature 350A and the second S/D feature 350B. The S/D contact openings may be formed by a series of photolithography and etching techniques similar to those described above with respect to forming the fins 304. In some embodiments, gate contact openings (not depicted) over the metal gate structures 360 are also formed in a similar manner.

Subsequently, a metal layer (not depicted) that includes, for example, nickel (Ni), titanium (Ti), tungsten (W), cobalt (Co), molybdenum (Mo), the like, or combinations thereof, is deposited over the exposed epitaxial layers 348A and 348B in their respective S/D contact openings. The metal layer may be deposited by any suitable process, such as CVD, PVD, ALD, the like, or combinations thereof, at elevated temperature to allow a bottom portion of the metal layer to react with the exposed epitaxial layers 348A and 348B. The reaction yields the first silicide layer 366A over the epitaxial layer 346A and the second silicide layer 366B over the epitaxial layer 346B. Any unreacted metal layer disposed over the first silicide layer 266A and the second silicide layer 266B may be removed by a suitable etching process.

Still referring to FIGS. 2A and 15, the method 200 at operation 218 forms a first S/D contact 372A and a second S/D contact 372B in the S/D contact openings. Subsequently, a conductive material (e.g., a metal) is deposited and planarized over the device 300, thereby filling the S/D contact openings to form a first S/D contact 372A electrically coupled to the first silicide layer 366A and a second S/D contact 372B electrically coupled to the second silicide layer 366B, as well as the gate contact openings to form first gate contacts 370A electrically coupled to the first metal gate structures 360A and second gate contacts 370B electrically coupled to the second metal gate structures 360B. In some embodiments, due to the first S/D feature 350A having a positive raised height RH1 and a relatively larger height CAP1 and the second S/D feature 350B having a negative raised height RH2 and a relatively smaller height CAP2, forming the S/D contact opening over the first S/D feature 350A may over-etch a portion of the epitaxial layer 348A. As a result, a bottom surface of the first S/D contact 372A extends to below a top surface of the first silicide layer 366A (previously the epitaxial layer 348A), while a bottom surface of the second S/D contact 372B remains over a top surface of the second silicide layer 366B.

Thereafter, referring back to FIG. 2A, the method 200 at operation 220 may perform additional operations to the device 300. For example, interconnect features (e.g., vias and conductive lines) may be formed to electrically couple components of the device 300, such as the S/D contacts 372A and 372B and the gate contacts 370A and 370B with additional features.

Figure 16:
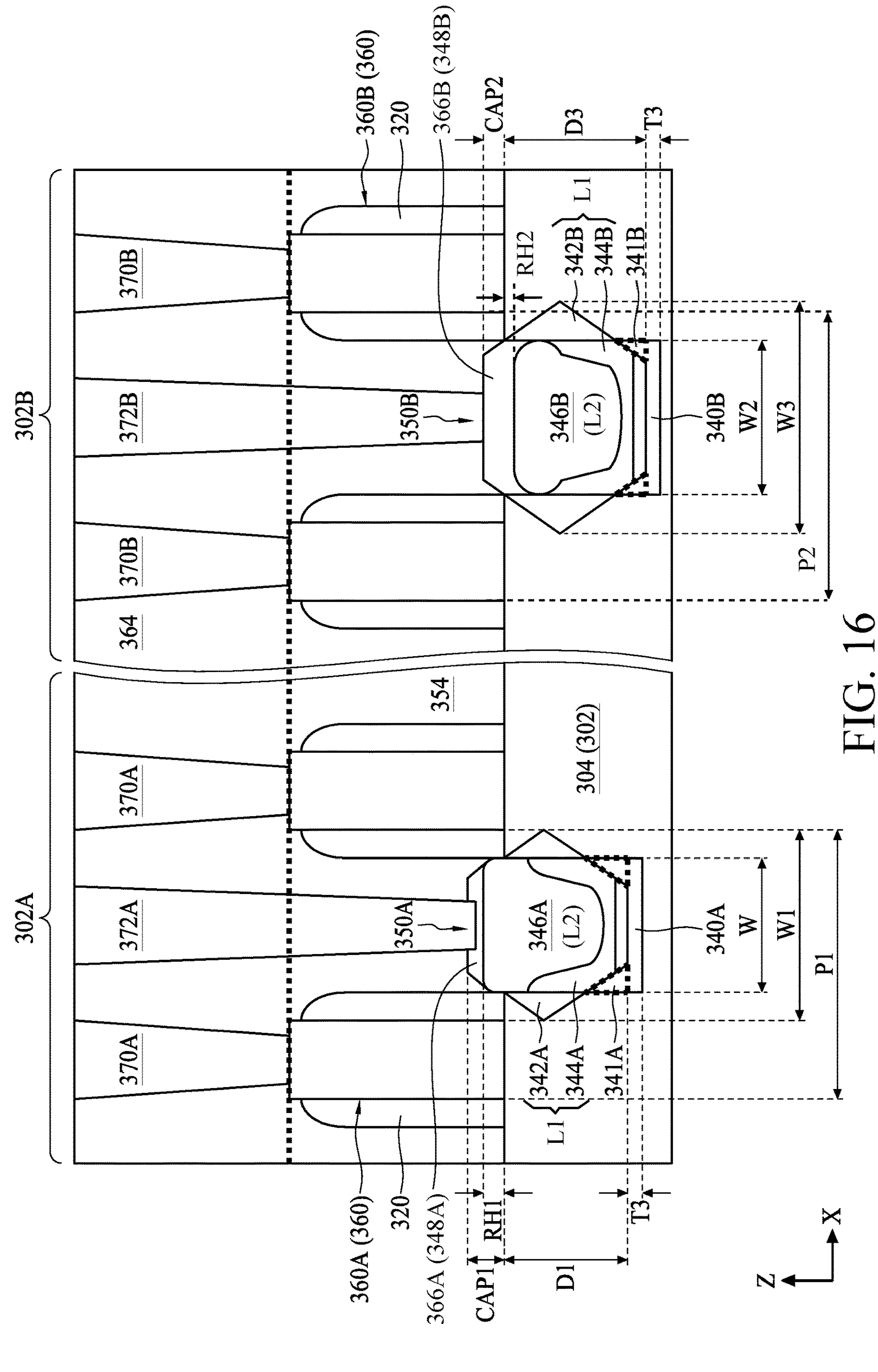

In some embodiments, referring to FIG. 16, which is in contrast to FIG. 15, the first doped layer 340A and the second doped layer 340B are tuned to have the same concentration of boron, such that they have the same thickness T3 despite being positioned at different depths with respect to the top surface 304T of the fin 304.

According to an aspect of the present disclosure, a semiconductor structure includes a semiconductor layer. The semiconductor structure includes a first epitaxial source/drain feature extending into the semiconductor layer. The semiconductor structure includes a first doped region located in the semiconductor layer below the first epitaxial source/drain feature. The first doped region includes a dopant at a first concentration. The semiconductor structure includes a second epitaxial source/drain feature extending into the semiconductor layer. The semiconductor structure includes a second doped region located in the semiconductor layer below the second epitaxial source/drain feature. The second doped region includes the dopant at a second concentration that is less than the first concentration.

According to another aspect of the present disclosure, a semiconductor structure includes a semiconductor layer. The semiconductor structure includes a first source/drain feature extending into the semiconductor layer. The semiconductor structure includes a first barrier layer below the first source/drain feature, where the first barrier layer is disposed at a first distance away from a top surface of the semiconductor layer. The first barrier layer includes a dopant at a first concentration. The semiconductor structure includes a second source/drain feature extending into the semiconductor layer. The semiconductor structure includes a second barrier layer below the second source/drain feature, where the second barrier layer is disposed at a second distance away from the top surface of the semiconductor layer. The first distance is less than the second distance. The second barrier layer includes the dopant at a second concentration.

According to yet another aspect of the present disclosure, a method includes performing a first etching process to form a recess in a semiconductor layer adjacent a gate structure. The method includes forming a doped layer in the recess. The method includes performing a second etching process to laterally expand a portion of the recess. The method includes forming a source/drain feature in the recess, where a bottom surface of the source/drain feature contacts the doped layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a semiconductor layer;

a first epitaxial source/drain feature extending into the semiconductor layer;

a first doped region located in the semiconductor layer below the first epitaxial source/drain feature, the first doped region including a dopant at a first concentration;

a second epitaxial source/drain feature extending into the semiconductor layer; and a second doped region located in the semiconductor layer below the second epitaxial source/drain feature, the second doped region including the dopant at a second concentration that is less than the first concentration.

2. The semiconductor structure of claim 1, wherein a first distance between a bottom surface of the first epitaxial source/drain feature and a top surface of the semiconductor layer is less than a second distance between a bottom surface of the second epitaxial source/drain feature and the top surface of the semiconductor layer.

3. The semiconductor structure of claim 1, wherein a first distance between the first doped region and a top surface of the semiconductor layer is less than a second distance between the second doped region and the top surface of the semiconductor layer.

4. The semiconductor structure of claim 1, wherein the first doped region has a first thickness and the second doped region has a second thickness that is less than the first thickness.

5. The semiconductor structure of claim 1, wherein the first epitaxial source/drain feature and the second epitaxial source/drain feature include silicon germanium, and wherein the dopant includes boron.

6. The semiconductor structure of claim 5, wherein the first epitaxial source/drain feature includes germanium at a third concentration and the second epitaxial source/drain feature includes germanium at a fourth concentration that is less than the third concentration.

7. The semiconductor structure of claim 1, wherein a first width of the first epitaxial source/drain feature and a second width of the second epitaxial source/drain feature each increase then decrease in a direction from a top surface of the semiconductor layer towards the first doped region and the second doped region, respectively.

8. The semiconductor structure of claim 7, wherein the first width has a first maximum and the second width has a second maximum that is greater than the first maximum.

9. A semiconductor structure, comprising:

a semiconductor layer;

a first source/drain feature extending into the semiconductor layer;

a first barrier layer below the first source/drain feature, the first barrier layer disposed at a first distance away from a top surface of the semiconductor layer and including a dopant at a first concentration;

a second source/drain feature extending into the semiconductor layer; and a second barrier layer below the second source/drain feature, the second barrier layer disposed at a second distance away from the top surface of the semiconductor layer and including the dopant at a second concentration, wherein the first distance is less than the second distance.

10. The semiconductor structure of claim 9, wherein the first concentration is the same as the second concentration.

11. The semiconductor structure of claim 9, wherein the first concentration is greater than the second concentration.

12. The semiconductor structure of claim 9, wherein a widest portion of the first source/drain feature has a first width and a widest portion of the second source/drain feature has a second width that is greater than the first width.

13. The semiconductor structure of claim 9, wherein a top surface of the first source/drain feature is separated from the top surface of the semiconductor layer by a third distance and a top surface of the second source/drain feature is separated from the top surface of the semiconductor layer by a fourth distance, and wherein the third distance is greater than the fourth distance.

14. The semiconductor structure of claim 9, wherein the first source/drain feature includes germanium at a third concentration and the second source/drain feature includes germanium at a fourth concentration that is less than the third concentration.

15. A method, comprising:

performing a first etching process to form a first recess in a semiconductor layer adjacent a first gate structure;

forming a first doped layer in the first recess, wherein the first doped layer includes a dopant at a first concentration;

performing a second etching process to laterally expand a portion of the first recess;

forming a source/drain feature in the first recess, wherein a bottom surface of the source/drain feature contacts the first doped layer;

performing a third etching process to form a second recess adjacent a second gate structure; and forming a second doped layer in the second recess, the second doped layer including the dopant at a second concentration that is less than the first concentration.

16. The method of claim 15, wherein forming the source/drain feature includes forming a plurality of epitaxial layers.

17. The method of claim 15, wherein forming the source/drain feature results in a top portion of the source/drain feature to protrude from a top surface of the semiconductor layer.

18. The method of claim 17, further comprising forming a silicide layer in the top portion of the source/drain feature.

19. The method of claim 18, further comprising:

forming a dielectric layer over the silicide layer;

performing a third etching process to form a contact opening in the dielectric layer; and forming a contact feature in the contact opening.

20. The method of claim 15, wherein the source/drain feature is a first source/drain feature, the method further comprising, after forming the first source/drain feature:

performing a fourth etching process to laterally expand the second recess; and forming a second source/drain feature in the second recess, the second source/drain feature contacting the second doped layer.

* * * * *